(12) United States Patent
Wang et al.

(10) Patent No.: US 12,477,915 B2
(45) Date of Patent: Nov. 18, 2025

(54) DISPLAY SUBSTRATE WITH PROTRUDING DISPLAY REGION EDGE, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Mingwen Wang, Beijing (CN); Yao Huang, Beijing (CN); Xingliang Xiao, Beijing (CN); Zhong Lu, Beijing (CN); Yuan Chen, Beijing (CN); Yamei Zhou, Beijing (CN); Yu Song, Beijing (CN); Wei Hu, Beijing (CN); Fuqiang Lin, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/781,419

(22) PCT Filed: May 31, 2021

(86) PCT No.: PCT/CN2021/097269
§ 371 (c)(1),
(2) Date: Jun. 1, 2022

(87) PCT Pub. No.: WO2022/252018
PCT Pub. Date: Dec. 8, 2022

(65) Prior Publication Data
US 2024/0107804 A1    Mar. 28, 2024

(51) Int. Cl.
*H10K 59/35*    (2023.01)
*H10K 59/121*    (2023.01)
(Continued)

(52) U.S. Cl.
CPC ......... *H10K 59/353* (2023.02); *H10K 59/121* (2023.02); *H10K 59/352* (2023.02); *H10K 59/00* (2023.02); *H10K 59/65* (2023.02)

(58) Field of Classification Search
CPC .. H10K 59/121; H10K 59/352; H10K 59/353; H10K 59/00; H10K 59/65
(Continued)

(56) References Cited

U.S. PATENT DOCUMENTS

2016/0315127 A1* 10/2016 Yoon ..................... H10K 59/352
2019/0326366 A1    10/2019 Fan et al.
(Continued)

FOREIGN PATENT DOCUMENTS

CN    110767694 A    2/2020

OTHER PUBLICATIONS

International Search Report in PCT/CN2021/097269 dated Mar. 4, 2022 in English.
(Continued)

*Primary Examiner* — Norman D Richards
*Assistant Examiner* — Laura M Dykes
(74) *Attorney, Agent, or Firm* — Collard & Roe, P.C.

(57) ABSTRACT

A display substrate and a display device are provided. The display substrate includes a display region including light emitting units; the light emitting units are arranged into light emitting unit rows, and the light emitting units in one of the light emitting unit rows are arranged along a first direction; the light emitting units include first light emitting units. In at least part of the display region: distances, in the first direction, between a light emitting region of one first light emitting unit and light emitting regions of two of the first light emitting units adjacent to the one first light emitting units are different, and/or distances, in a second direction, between a light emitting region of one first light emitting
(Continued)

units and the light emitting regions of two of the first light emitting units adjacent to the one first light emitting units are different.

18 Claims, 7 Drawing Sheets

(51) Int. Cl.
*H10K 59/00* (2023.01)
*H10K 59/65* (2023.01)

(58) Field of Classification Search
USPC .......................................................... 257/40
See application file for complete search history.

(56) References Cited

U.S. PATENT DOCUMENTS

| | | |
|---|---|---|
| 2020/0066809 A1 | 2/2020 | Liu |
| 2021/0013277 A1 | 1/2021 | Liu et al. |
| 2022/0093682 A1* | 3/2022 | Chang ................... H01L 25/167 |

OTHER PUBLICATIONS

Written Opinion of the International Searching Authority in PCT/CN2021/097269 dated Mar. 4, 2022 in English.

* cited by examiner

DISPLAY SUBSTRATE WITH PROTRUDING DISPLAY REGION EDGE, AND DISPLAY DEVICE

CROSS REFERENCE TO RELATED APPLICATIONS

This application is the National Stage of PCT/CN2021/097269 filed on May 31, 2021, the disclosure of which is incorporated by reference.

TECHNICAL FIELD

At least one embodiment of the present disclosure relates to a display substrate and a display device.

BACKGROUND

With people's constant pursuit of visual effects of display products, narrow frame or even full-screen display has become a new trend in the development of organic light emitting diode (OLED) display products. With the screen proportion of many mobile phones gradually increasing steadily, full-screen has become the current trend. The front camera is the key to a full screen design. In order to achieve a higher screen proportion, display products with screens such as notch screen, water drop screen and hole-digging screen have appeared one after another. These full screen forms have increased the screen proportion by sacrificing the appearance of mobile phones. Therefore, in recent years, under the trend of full screen, the flexible screen integrated with an under-screen camera solves the digging hole pain point of traditional full screen display, and the high screen proportion brings a new visual experience to users.

SUMMARY

At least one embodiment of the present disclosure provides a display substrate. The display substrate includes: a display region including a plurality of light emitting units, the plurality of light emitting units are arranged into a plurality of light emitting unit rows, and the light emitting units in one of the plurality of light emitting unit rows are arranged along a first direction; the plurality of light emitting units include a plurality of first light emitting units; in at least part of the display region: distances, in the first direction, between a light emitting region of one of the first light emitting units and light emitting regions of two of the first light emitting units respectively adjacent to the one of the first light emitting units in the first direction are different, and/or distances, in a second direction, between a light emitting region of one of first light emitting units and light emitting regions of two of the first light emitting units adjacent to the one of the first light emitting units in the second direction are different, and the first direction intersects the second direction.

For example, in the display substrate provided by an embodiment of the present disclosure, in at least one of the plurality of light emitting unit rows in the at least part of the display region, the distances, in the first direction, between the light emitting region of one of the first light emitting units and the light emitting regions of two of the first light emitting units adjacent to the one of the first light emitting units in the first direction are a first spacing distance and a second spacing distance, respectively; light emitting regions of the first light emitting units included in the at least one of the light emitting unit rows are arranged at intervals along the first direction to form a plurality of spacings, the plurality of spacings include the first spacing distance and the second spacing distance, and the first spacing distance and the second spacing distance are alternately arranged in the first direction.

For example, in the display substrate provided by an embodiment of the present disclosure, in the at least part of the display region, the distances, in the second direction, between the light emitting region of one of the first light emitting units and the light emitting regions of two of the first light emitting units adjacent to the one of the first light emitting units in the second direction are a third spacing distance and a fourth spacing distance, respectively; in the second direction, spacings between light emitting regions of two adjacent ones of the first light emitting units in the second direction are arranged in such a way that the third spacing distance and the fourth spacing distance are alternately arranged.

For example, in the display substrate provided by an embodiment of the present disclosure, the display substrate includes: a base substrate; and a plurality of light emitting unit groups located on the base substrate, each of the plurality of light emitting unit groups includes at least one of the light emitting units. The display region includes a first display region, a second display region and a third display region, the first display region is on at least one side of the third display region, at least part of the second display region is located between the first display region and the third display region, and the at least part of the display region includes the second display region; the plurality of light emitting unit groups include a plurality of first light emitting unit groups located in the first display region, a plurality of second light emitting unit groups located in the second display region, and a plurality of third light emitting unit groups located in the third display region; the at least one of the light emitting units in each of the plurality of light emitting unit groups includes the first light emitting unit, in the first display region, light emitting regions of the first light emitting units located in a same one of the plurality of light emitting unit rows are arranged at equal intervals along the first direction, and a distance, in the first direction, between the light emitting regions of two adjacent ones of the first light emitting units located in the same one of the plurality of light emitting unit rows is a fifth spacing distance, at least one of the first spacing distance and the second spacing distance is different from the fifth spacing distance.

For example, in the display substrate provided by an embodiment of the present disclosure, in the third display region, light emitting regions of the first light emitting units in a same one of the plurality of light emitting unit rows are arranged at equal intervals along the first direction, and a distance, in the first direction, between light emitting regions of two adjacent ones of the first light emitting units in the same one of the plurality of light emitting unit rows is a sixth spacing distance, at least one of the first spacing distance and the second spacing distance is different from the sixth spacing distance.

For example, in the display substrate provided by an embodiment of the present disclosure, the sixth spacing distance is greater than the first spacing distance, the first spacing distance is greater than the fifth spacing distance, and the fifth spacing distance is greater than the second spacing distance.

For example, in the display substrate provided by an embodiment of the present disclosure, an area of the light emitting region of at least one of the first light emitting units in the third display region is different from an area of the light emitting region of the first light emitting unit in the first display region, and/or an area of the light emitting region of at least one of the first light emitting units in the third display region is different from an area of the light emitting region of the first light emitting unit in the second display region.

For example, in the display substrate provided by an embodiment of the present disclosure, a ratio of an area of the light emitting region of at least one of the first light emitting units in the third display region to an area of the light emitting region of the first light emitting unit in the first display region ranges from 0.8 to 2.5, and/or a ratio of an area of the light emitting region of at least one of the first light emitting units in the third display region to an area of the light emitting region of each of the first light emitting units in the second display region ranges from 0.8 to 2.5.

For example, in the display substrate provided by an embodiment of the present disclosure, an area of the light emitting region of the first light emitting unit in the second light emitting unit group is less than or equal to an area of the light emitting region of the first light emitting unit in the third light emitting unit group adjacent to the second light emitting unit group.

For example, in the display substrate provided by an embodiment of the present disclosure, the at least one of the light emitting units in each of the plurality of light emitting unit groups further includes a second light emitting unit and a third light emitting unit, the first direction is a row direction, the second direction is a column direction, in at least one of the plurality of light emitting unit groups, the second light emitting unit and the third light emitting unit are located in different rows, and the first light emitting unit and the second light emitting unit are located in a same row.

For example, in the display substrate provided by an embodiment of the present disclosure, the first light emitting unit, the second light emitting unit and the third light emitting unit are respectively configured to provide light of different colors.

For example, in the display substrate provided by an embodiment of the present disclosure, the at least one of the light emitting units in each of the plurality of light emitting unit groups further includes a fourth light emitting unit, the first light emitting unit and the fourth light emitting unit are configured to provide light of a same color.

For example, in the display substrate provided by an embodiment of the present disclosure, in at least one of the plurality of second light emitting unit groups adjacent to the plurality of first light emitting unit groups, a distance, in the second direction, between the light emitting region of the first light emitting unit and the light emitting region of the fourth light emitting unit is a first distance, a distance, in the second direction, between the light emitting region of the fourth light emitting unit in the at least one of the plurality of second light emitting unit groups and the light emitting region of the first light emitting unit in the first light emitting unit group adjacent to the at least one of the plurality of second light emitting unit groups is a second distance, and the first distance is greater than the second distance.

For example, in the display substrate provided by an embodiment of the present disclosure, the first distance is greater than a size, in the second direction, of the light emitting region of the third light emitting unit in the second light emitting unit group.

For example, in the display substrate provided by an embodiment of the present disclosure, in at least one of the second light emitting unit groups adjacent to the plurality of first light emitting unit groups, a first straight line extending in the first direction passes through the first light emitting unit and the second light emitting unit, a second straight line extending in the first direction passes through the fourth light emitting unit in the at least one of the second light emitting unit groups adjacent to the plurality of first light emitting unit groups and the second light emitting unit in the first light emitting unit groups.

For example, in the display substrate provided by an embodiment of the present disclosure, the plurality of second light emitting unit groups include first sub light emitting unit groups and second sub light emitting unit groups alternately arranged along the first direction, and at least one of the plurality of third light emitting unit groups adjacent to the plurality of second light emitting unit groups and the second sub light emitting unit group are located in a same column of light emitting unit groups; in at least one of the plurality of first light emitting unit groups, a distance between the light emitting region of the first light emitting unit and the light emitting region of the second light emitting unit is a third distance; in at least one of the first sub light emitting unit groups, a distance between the light emitting region of the first light emitting unit and the light emitting region of the second light emitting unit is a fourth distance; in at least one of the second sub light emitting unit groups, a distance between the light emitting region of the first light emitting unit and the light emitting region of the second light emitting unit is a fifth distance, the fifth distance is greater than the fourth distance, and the fourth distance is greater than the third distance.

For example, in the display substrate provided by an embodiment of the present disclosure, in at least one of the first sub light emitting unit groups, a distance between a center line extending in the second direction of the light emitting region of the first light emitting unit and a center line extending in the second direction of the light emitting region of the fourth light emitting unit is a sixth distance; in at least one of the second sub light emitting unit groups, a distance between a center line extending in the second direction of the light emitting region of the first light emitting unit and a center line extending in the second direction of the light emitting region of the fourth light emitting unit is a seventh distance, and the seventh distance is greater than the sixth distance.

For example, in the display substrate provided by an embodiment of the present disclosure, in at least one of the first sub light emitting unit groups, a distance between a center line extending in the second direction of the light emitting region of the second light emitting unit and a center line extending in the second direction of the light emitting region of the fourth light emitting unit is an eighth distance; in at least one of the second sub light emitting unit groups, a distance between a center line extending in the second direction of the light emitting region of the second light emitting unit and a center line extending in the second direction of the light emitting region of the fourth light emitting unit is a ninth distance, and a ratio of the ninth distance to the eighth distance ranges from 0.8 to 1.2.

For example, in the display substrate provided by an embodiment of the present disclosure, the display substrate further includes a plurality of first pixel circuit groups, a plurality of second pixel circuit groups and a plurality of third pixel circuit groups, the plurality of first pixel circuit groups are respectively connected with the plurality of first light emitting unit groups in one-to-one correspondence and are located in the first display region, the plurality of second pixel circuit groups are respectively connected with the plurality of second light emitting unit groups in one-to-one correspondence, and are located in the second display region, the plurality of third pixel circuit groups are respectively connected with the plurality of third light emitting unit groups in one-to-one correspondence, and are located in regions other than the third display region in the display substrate.

For example, in the display substrate provided by an embodiment of the present disclosure, the plurality of first pixel circuit groups include a plurality of first pixel circuits and the plurality of second pixel circuit groups include a plurality of second pixel circuits, and an arrangement density of the plurality of first pixel circuits in the first display region is greater than or equal to an arrangement density of the plurality of second pixel circuits in the second display region.

For example, in the display substrate provided by an embodiment of the present disclosure, in at least one of the plurality of second pixel circuit groups, the second pixel circuit includes two sub-pixel circuits configured to be connected with a same one of the light emitting units; in the first pixel circuit group, the first pixel circuit includes one sub-pixel circuit, and different sub-pixel circuits are configured to be connected with different light emitting units.

For example, in the display substrate provided by an embodiment of the present disclosure, the display substrate further includes: a plurality of data lines extending along the second direction, the plurality of data lines include a first sub data line and a second sub data line; the first display region includes a first pixel circuit column, the second display region includes a second pixel circuit column, and the first pixel circuit column and the second pixel circuit column are located in different columns; the first sub data line is connected with the first pixel circuit column, the second sub data line is connected with the second pixel circuit column, and the first sub data line and the second sub data line are connected by a data line connection portion, an extending direction of the data line connection portion intersects the second direction, and the data line connection portion and the plurality of data lines are located in different layers.

For example, in the display substrate provided by an embodiment of the present disclosure, the first display region further includes a third pixel circuit column, and the second display region further includes a fourth pixel circuit column, and the third pixel circuit column and at least part of the fourth pixel circuit column are located in a same column; the plurality of data lines further include a third sub data line and a fourth sub data line, the third sub data line is connected with the third pixel circuit column, the fourth sub data line is connected with the fourth pixel circuit column, and the third sub data line and the fourth sub data line are a continuous data line extending along the second direction.

For example, in the display substrate provided by an embodiment of the present disclosure, the display substrate further includes: a plurality of power signal lines extending along the second direction, the plurality of power signal lines include a plurality of first sub power signal lines and a plurality of second sub power signal lines, the plurality of first sub power signal lines are connected with the plurality of first pixel circuit groups, the plurality of second sub power signal lines are connected with the plurality of second pixel circuit groups, and the plurality of first sub power signal lines are configured to transmit first power supply signals, and the plurality of second sub power signal lines are configured to transmit second power supply signals.

For example, in the display substrate provided by an embodiment of the present disclosure, the plurality of second sub power signal lines include a second sub power signal line located on the same straight line as at least one of the first sub power signal lines, and a gap is provided between the first sub power signal line and the second sub power signal line located on the same straight line.

For example, in the display substrate provided by an embodiment of the present disclosure, the display substrate further includes a light shielding layer, located on an edge of the third display region, and an orthographic projection of the light shielding layer on the base substrate is overlapped with orthographic projections of the second sub data line and the fourth sub data line on the base substrate, the light shielding layer is located at a side of a film layer where the data line connection portion is located away from a film layer where the plurality of power signal lines are located, and at least one of the plurality of second sub power signal lines is connected with the light shielding layer.

At least one embodiment of the present disclosure provides a display device, including the display substrate in any embodiment of the present disclosure.

BRIEF DESCRIPTION OF THE DRAWINGS

In order to more clearly explain the technical solution of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

Figure 1:
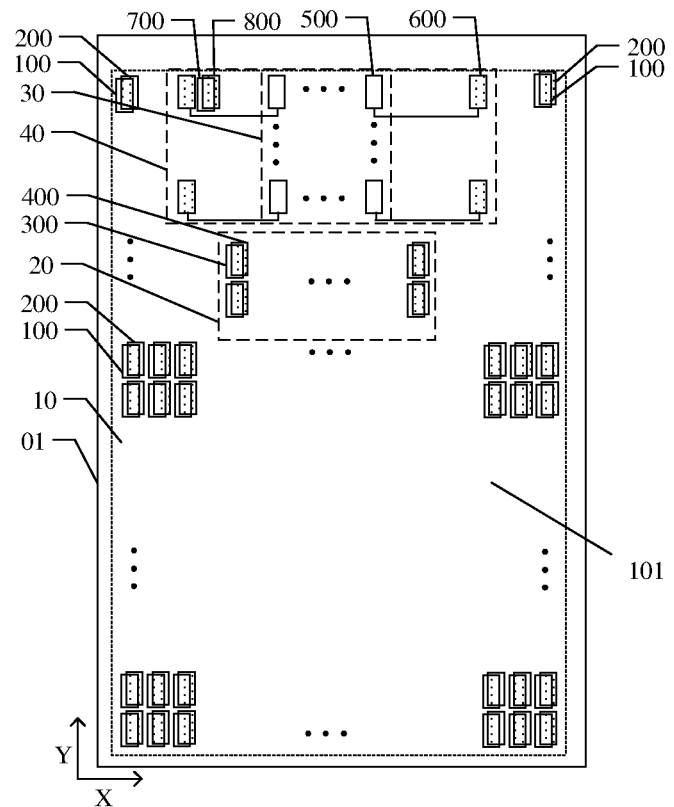
FIG. 1 is a schematic diagram of a planar structure of a display substrate provided by at least one embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects.

Under-screen camera refers to that a front camera is located under a screen but does not affect the display function of a screen. Upon the front camera being not used, the screen above the camera can still display images normally. From the appearance, the under-screen camera does not have any camera holes, which really achieves a full-screen display effect.

In the research, the inventor(s) of the present application has noticed that: at present, an organic light emitting diode display device adopting an under-screen camera design is provided with a low-density display region (L region), a high-density display region (H region) and a density transition region between the low-density display region (L region) and the high-density display region (H region). Generally, in order to ensure the display effect of the organic light emitting diode display device, for example, in order to keep the display brightness uniformity of the low-density display region (L region), the high-density display region (H region), and the density transition region as consistent as possible, the area of the light emitting region of each light emitting unit in the low-density display region (L region) needs to be set greater than the area of the light emitting region of each light emitting unit in the high-density display region (H region) and the density transition region. However, in the case where the area of the light emitting region of each light emitting unit in the low-density display region (L region) increases, the area of a light emitting layer used to form the light emitting region will also increase, resulting in the phenomenon that the light emitting layers of the light emitting units located at a junction position of the low-density display region (L region) and the density transition region are likely to overlap with each other, which will adversely affect the display effect of the organic light emitting diode display device.

Embodiments of the present disclosure provide a display substrate and a display device. The display substrate includes a display region including a plurality of light emitting units; the plurality of light emitting units are arranged into a plurality of light emitting unit rows, and the light emitting units in one of the plurality of light emitting unit rows are arranged along a first direction; the plurality of light emitting units include a plurality of first light emitting units. In at least part of the display region, distances, in the first direction, between a light emitting region of one of the first light emitting units and light emitting regions of two of the first light emitting units adjacent to the one of the first light emitting units are different, and/or distances, in a second direction, between a light emitting region of one of the first light emitting units and the light emitting regions of two of the first light emitting units adjacent to the one of the first light emitting units are different, and the first direction intersects the second direction.

In the display substrate provided by the embodiments of the present disclosure, by adjusting the distances between the light emitting regions of adjacent ones of the first light emitting units in the first direction or the second direction, for example, by arranging the light emitting regions of the first light emitting units with unequal distances in the first direction or arranging the light emitting regions of the first light emitting units with unequal distances in the second direction, the possible overlapping phenomenon between the light emitting regions or light emitting layers of adjacent ones of the first light emitting units can be weakened or avoided, thereby weakening or avoiding the possible adverse effects on the display effect of the display substrate, and it is beneficial to improving the display effect of the display substrate.

Hereinafter, embodiments of the present disclosure will be explained in detail with reference to the accompanying drawings. It should be noted that the same reference numerals in different drawings will be used to refer to the same elements already described.

Figure 2:
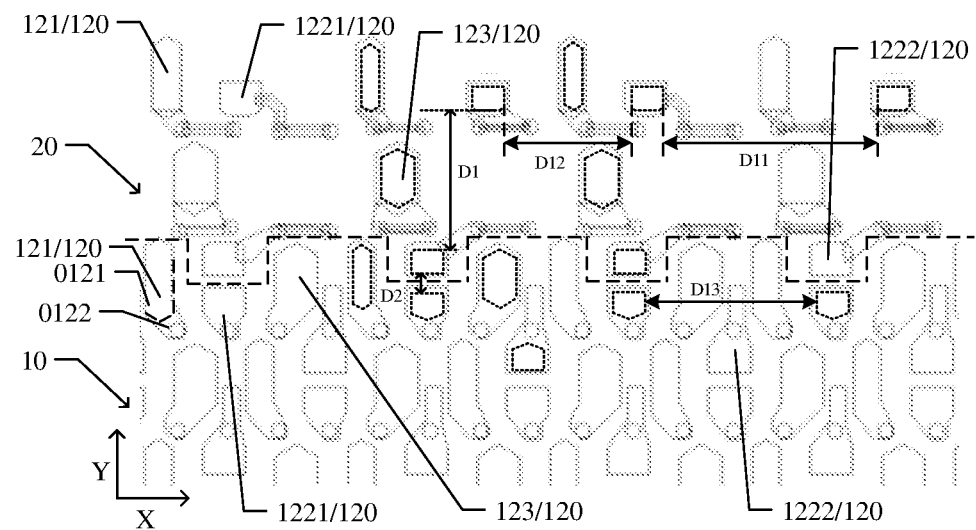
FIG. 2 is a partial schematic diagram of an example of light emitting units at a junction position between a first display region and a second display region in the display substrate shown in FIG. 1.
Figure 3:
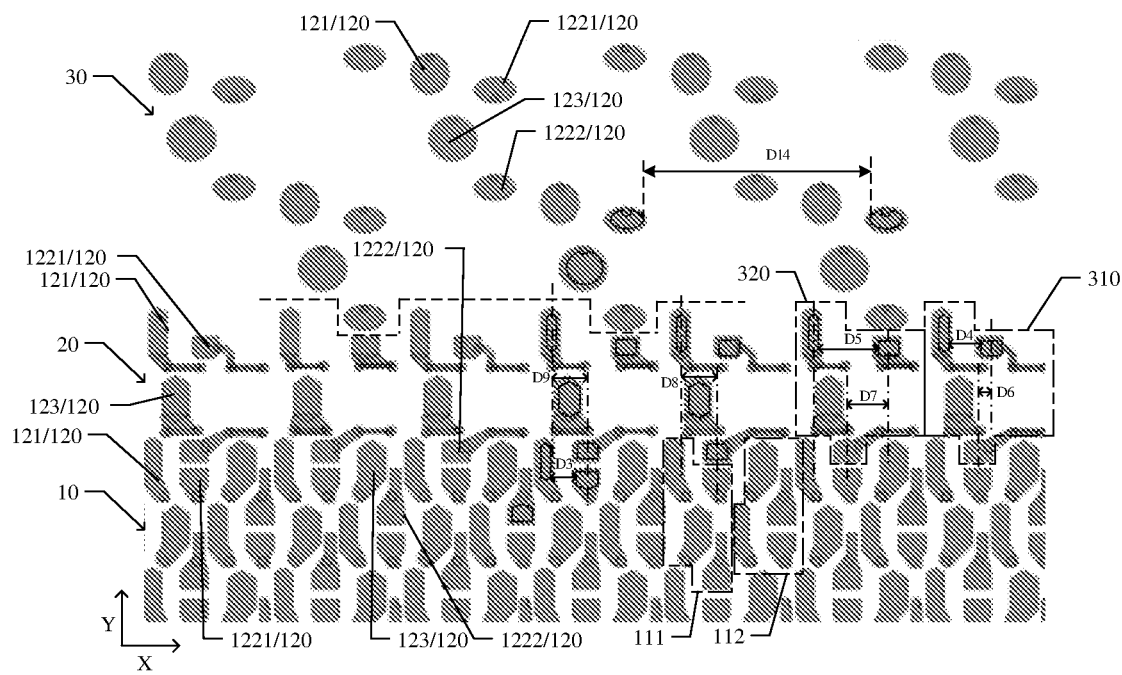
FIG. 3 is a partial schematic diagram of an example of light emitting units at junction positions among a first display region, a second display region and a third display region in the display substrate shown in FIG. 1.

FIG. 1 is a schematic diagram of a plane structure of a display substrate provided in at least one embodiment of the present disclosure, FIG. 2 is a partial schematic diagram of an example of light emitting units at a junction position of a first display region and a second display region in the display substrate shown in FIG. 1, and FIG. 3 is a partial schematic diagram of an example of light emitting units at junction positions among a first display region, a second display region and a third display region in the display substrate shown in FIG. 1.

For example, as illustrated by FIGS. 1 to 3, the display substrate includes a display region 101 including a plurality of light emitting units 120. The plurality of light emitting units 120 are arranged into a plurality of light emitting unit rows, and the light emitting units 120 in one of the plurality of light emitting unit rows are arranged along a first direction X, for example, respective light emitting units 120 in one of the plurality of light emitting unit rows are sequentially arranged along the first direction X to form one row of light emitting units. The plurality of light emitting units 120 include a plurality of first light emitting units 1221.

It should be noted that, the X direction shown in the drawings is the first direction and the Y direction shown in the drawings is the second direction. For example, the first direction X and the second direction Y may be perpendicular to each other, but the present disclosure is not limited thereto. For example, the first direction and the second direction can be interchanged. For example, the embodiment of the present disclosure is described by taking the first direction X as a row direction as an example. For example, the second direction Y may be a column direction, and the light emitting units 120 arranged along the first direction X belong to one row of light emitting units arranged along the row direction. The embodiment of the present disclosure is not limited thereto, and the row direction and the column direction may be interchanged.

For example, the light emitting unit 120 can refer to a light emitting element (such as an organic light emitting element), and includes a first electrode, a second electrode, and a light emitting layer between the first electrode and the second electrode. The first electrode, the light emitting layer, and the second electrode are sequentially stacked in a direction perpendicular to, for example, a base substrate the display substrate. The second electrode of each light emitting unit 120 is schematically shown in FIGS. 2 and 3. For example, the second electrode of each light emitting unit 120 includes a main body electrode and a connection electrode, the shape of the main body electrode is basically the same as that of the light emitting region (refer to the following description) of each light emitting unit 120, and the connection electrode is configured to be connected with a pixel circuit, such as a thin film transistor included in a pixel circuit. For example, the case where the light emitting unit 121 (e.g., the second light emitting unit 121 described below) in the region 10 (e.g., the first display region 10 described below) shown in FIGS. 1 to 3 is taken as an example, the shape of the main body electrode 0121 of the light emitting unit 121 is roughly hexagonal, and the edge of the main body electrode 0121 surrounds the light emitting region, while the connection electrode 0122 is the part of the second electrode except the main body electrode 0121.

In at least part of the display region 101, for example, in the region 20 (for example, the second display region 20 described below) shown in FIGS. 1 to 3, distances, in the first direction X, between a light emitting region (the dotted boxes shown in FIGS. 2 and 3) of one of the first light emitting units 1221 and light emitting regions of two of the first light emitting units 1221 adjacent to the one of the first light emitting units 1221 are different. For example, taking the region 20 shown in FIGS. 1 to 3 as an example, in the region 20, the distances in the first direction X between the light emitting region of one of the first light emitting units 1221 and the light emitting regions of two first light emitting units 1221 located at the left and right sides of the one of the first light emitting units 1221 and adjacent to the one of the first light emitting units 1221 are D12 and D11 (for example, the second spacing distance and the first spacing distance described below), respectively; D11 is different from D12. In other words, the distance D11 in the first direction X between the light emitting region of the first light emitting unit 1221 and the light emitting region of the right adjacent first light emitting unit 1221 is different from the distance D12 in the first direction X between the light emitting region of the first light emitting unit 1221 and the light emitting region of the left adjacent first light emitting unit 1221. For example, in the embodiment of the present disclosure, the direction indicated by the arrow of the X direction is to the right.

It should be noted that the embodiment of the present disclosure schematically shows the distance between the edges of two light emitting regions adjacent to each other in the first direction X, or the distance between two points of two light emitting regions which are closest to each other in the first direction X. However, it should be noted that the embodiment of the present disclosure is not limited thereto, and the above-mentioned distances D11 and D12 may also refer to the distances between the centers of two light emitting regions in the first direction X, that is, the distances between two straight lines extending along the second direction Y and passing through the centers of the above-mentioned two light emitting regions, for example, the first direction X is perpendicular to the second direction Y. It should be noted that the above-mentioned distances D11 and D12 are all under the same definition, that is, they can both be the distances between the edges of two light emitting regions which are adjacent to each other in the first direction X, or the distances between the centers of two light emitting regions in the first direction X, etc.

For example, each light emitting unit 120 includes a light emitting region, where the "light emitting region" may refer to a two-dimensional planar region that is parallel to the display substrate, such as the base substrate. For example, the display substrate further includes a pixel defining layer on the base substrate, which includes an opening for defining the light emitting region of the light emitting unit 120, the opening exposes the second electrode of the light emitting unit 120. In the case where at least part of the subsequent light emitting layer of the light emitting unit 120 is formed in the opening of the pixel defining layer, the light emitting layer located in the opening is in contact with the second electrode, so that this part can drive the light emitting layer to emit light to form the light emitting region. It should be noted that, because of process and other reasons, the size of a part of the opening of the pixel defining layer, which is away from the base substrate, is slightly greater than the size of a part of the opening of the pixel defining layer, which is close to the base substrate; or, the size of the opening of the pixel defining layer gradually increases in a direction from a side close to the base substrate to a side away from the base substrate. Therefore, the size of the light emitting region may be slightly different from the size of the opening at different positions in the pixel defining layer, but the shape and size of the whole regions are basically the same or similar. For example, the orthographic projection of the light emitting region on the base substrate is approximately coincident with the orthographic projection of the corresponding opening of the pixel defining layer on the base substrate. For example, the orthographic projection of the light emitting region on the base substrate completely falls within a region enclosed by the orthographic projection of the corresponding opening of the pixel defining layer on the base substrate, and the two have the similar shapes, so the orthographic projection area of the light emitting region on the base substrate is slightly smaller than the orthographic projection area of the corresponding opening of the pixel defining layer on the base substrate.

Therefore, by adjusting the distances between the light emitting regions of adjacent first light emitting units 1221 in the first direction X, the light emitting regions of the first light emitting units 1221 are arranged at unequal distances in the first direction X, for example, as shown in FIG. 2, D11 is different from D12, which can weaken or avoid the possible overlapping phenomenon between the light emitting regions or light emitting layers of adjacent first light emitting units 1221, thereby weakening or avoiding the possible adverse effects on the display effect of the display substrate, which is conducive to improving the display effect of the display substrate.

In some embodiments of the present disclosure, in at least part of the display region 101, such as the region 20 shown in FIGS. 1 to 3 (for example, the second display region 20 described below), the distances in the second direction Y between the light emitting region of one of the first light emitting units 1221 and the light emitting regions of two of the first light emitting units 1221 adjacent to the one of the first light emitting units 1221 may be different, and the first direction X is intersected with the second direction Y, for example, the first direction X can be perpendicular to the second direction Y. For example, in the region 20 shown in FIGS. 1 to 3, the distances in the second direction Y between the light emitting region of one of the first light emitting units 1221 and the light emitting regions of two of the first light emitting units 1221 located at the upper and lower sides of the one of the first light emitting units 1221 and adjacent to the one of the first light emitting units 1221 in the second direction Y (for example, the third spacing distance and the fourth spacing distance described below) are different from each other. In other words, the distance in the second direction Y between the light emitting region of the first light emitting unit 1221 and the light emitting region of the upper adjacent first light emitting unit 1221 is different from the distance in the second direction Y between the light emitting region of the first light emitting unit 1221 and the light emitting region of the lower adjacent first light emitting unit 1221. For example, in the embodiment of the present disclosure, the direction indicated by the arrow of the Y direction is upward.

It should be noted that the above-mentioned distance in the second direction Y may refer to the distance between the edges of two light emitting regions adjacent to each other in the second direction Y, or the distance may also refer to the distance between two points of two light emitting regions which are closest to each other in the second direction Y. Alternatively, the distance in the second direction Y may also refer to the distance between the centers of two light emitting regions in the second direction Y, that is, the distance between two straight lines extending along the first direction X and passing through the centers of the two light emitting regions, for example, the first direction X is perpendicular to the second direction Y. It should be noted that the above-mentioned distances in the second direction Y are both under the same definition, that is, they can both be the distances in the second direction Y between the edges of two light emitting regions adjacent to each other, or the distances in the second direction Y between the centers of two light emitting regions, etc.

In some embodiments of the present disclosure, in at least part of the display region 101, for example, in the region 20 (for example, the second display region 20 described below) shown in FIGS. 1 to 3, the distances in the first direction X between the light emitting region of one of the first light emitting units 1221 and the light emitting regions of two of the first light emitting units 1221 adjacent to the one of the first light emitting units 1221 respectively may be different from each other, and the distances in the second direction Y between the light emitting region of the one of the first light emitting units 1221 and the light emitting regions of two of the first light emitting units 1221 adjacent to the one of the first light emitting units 1221 in the second direction Y are also different from each other. For example, in the region 20 shown in FIGS. 1 to 3, the distances D12 and D11 between the light emitting region of the one of the first light emitting units 1221 and the light emitting regions of two of the first light emitting units 1221 adjacent to the one of the first light emitting units 1221 in the first direction X are different from each other, and the distances between the light emitting regions of the one of the first light emitting units 1221 and the light emitting regions of two of the first light emitting units 1221 adjacent to the one of the first light emitting units 1221 in the second direction Y are different.

In some embodiments of the present disclosure, as illustrated by FIGS. 1 to 3, in at least one row of light emitting units 120 in at least part of the display region 101, for example, in one row of light emitting units 120 in the region 20 shown in FIGS. 1 to 3, the distances in the first direction X between the light emitting region of one of the first light emitting units 1221 and the light emitting regions of two of the first light emitting units 1221 adjacent to the one of the first light emitting units in the first direction X are a first spacing distance D11 and a first spacing distance D11, respectively. In this row of light emitting units 120, the light emitting regions of multiple first light emitting units 1221 are arranged at intervals along the first direction X to form a plurality of spacings, which include the first spacing distance D11 and the second spacing distance D12, for example, the plurality of spacings include a plurality of first spacing distances D11 and a plurality of second spacing distances D12, which are alternately arranged in the first direction X. For example, in this row of light emitting units 120, the plurality of spacings among the light emitting regions of the first light emitting units 1221 arranged along the first direction X are the first spacing distance D11, the second spacing distance D12, the first spacing distance D11, the second spacing distance D12, and so on.

In some embodiments of the present disclosure, in the above-mentioned at least part of the display region 101, the distances in the second direction Y between the light emitting region of the one of the first light emitting units 1221 and the light emitting regions of two of the first light emitting units 1221 adjacent to the one of the first light emitting units 1221 in the second direction Y are a third spacing distance and a fourth spacing distance respectively. For example, in the case where the third spacing distance and the fourth spacing distance which are respective distances between the light emitting regions of the one of the first light emitting units 1221 and the light emitting regions of the two of the first light emitting units 1221 adjacent to the one of the first light emitting units 1221 in the second direction Y are also different from each other, the spacings between the light emitting regions of adjacent first light emitting units 1221 in the second direction Y may be arranged in such a way that the third spacing distance and the fourth spacing distance are alternately arranged. For example, the spacings among the light emitting regions of the first light emitting units 1221 arranged along the second direction Y are the third spacing distance, the fourth spacing distance, the third spacing distance, the fourth spacing distance, and so on.

In some embodiments of the present disclosure, as illustrated by FIGS. 1 to 3, the display substrate includes a base substrate 01 and a plurality of light emitting unit groups located on the base substrate 01, the light emitting unit groups include at least one light emitting unit 120, for example, the at least one light emitting unit 120 includes a first light emitting unit 1221.

The display region 101 includes a first display region 10, a second display region 20, and a third display region 30. The first display region 10 is located at at least one side of the third display region 30, and at least part of the second display region 20 is located between the first display region 10 and the third display region 30, for example, the first display region 10 is located at one side of the second display region 20 in the second direction Y. The above-mentioned at least part of the display region 101 includes the second display region 20.

For example, as illustrated by FIG. 1, the first display region 10 may surround the third display region 30, for example, the first display region 10 may be located at both sides of the third display region 30 in the first direction X and at least one side in the second direction Y. For example, as illustrated by FIG. 1, the first display region 10 surrounds the second display region 20. For example, the first display region 10 includes parts located at both sides of the second display region 20 in the first direction X and at least one side in the second direction Y. The embodiment of the present disclosure schematically shows that the third display region 30 is located in the middle of the top of the whole display region 101 (a complete area for display in the display substrate, including the first display region 10, the second display region 20, the third display region 30, etc.), but is not limited thereto. For example, the position of the third display region 30 can be set according to actual needs, such as the upper left corner or the upper right corner of the whole display region 101. FIG. 1 schematically shows that the shapes of the second display region 20 and the third display region 30 are both rectangular, but the embodiment of the present disclosure is not limited thereto, and the shape of at least one of the second display region 20 and the third display region 30 can also be a regular shape such as a circle or an ellipse, or an irregular shape, and the embodiment of the present disclosure is not limited thereto.

It should be noted that FIG. 1 only schematically shows the shapes, sizes, and positional relationships of the first display region 10, the second display region 20, and the third display region 30, etc. The shapes of each display region in actual products can be regular or irregular. For example, the second display region 20 may include a protruding region, the first display region 10 may include a concave region, the protruding region of the second display region 20 may be inserted into the concave region of the first display region 10, and the protruding region of the second display region 20 may have a complementary shape to the concave region of the first display region 10. For example, a side of the second display region 20 away from the first display region 10 may also include a concave region.

The embodiment of the present disclosure schematically shows that the distance between the light emitting regions of the two light emitting units 120 as mentioned above refers to the distance between the edges of the light emitting regions of the two light emitting units 120 which are adjacent to each other, but the embodiment of the present disclosure is not limited thereto, and the distance between the light emitting regions of the two light emitting units 120 as mentioned above may also be the distance between the centers of the light emitting regions of the two light emitting units 120 in the first direction X (or the second direction Y), that is, the distance between two straight lines passing through two centers of the two light emitting regions of the two light emitting units 120 and extending along the second direction (for example, the first direction X is perpendicular to the second direction Y). In the embodiment of the present disclosure, by arranging one row of first light emitting units 1221 in the second display region 20 at unequal distances, the possible overlapping phenomenon between the light emitting regions or light emitting layers of the first light emitting units 1221 in the second display region 20 and the light emitting regions or light emitting layers of light emitting units which are adjacent to the second display region and in the third display region 30 can be prevented.

The plurality of light emitting unit groups include a plurality of first light emitting unit groups 100 in the first display region 10, a plurality of second light emitting unit groups 300 in the second display region 20, and a plurality of third light emitting unit groups 500 in the third display region 30. In the first display region 10, the light emitting regions of the first light emitting units 1221 in the same row of light emitting unit 120 are arranged at equal intervals along the first direction X, and the spacing between the light emitting regions of two adjacent first light emitting units 1221 in the same row of light emitting units 120 in the first direction X is a fifth spacing distance D13. At least one of the first spacing distance D11 and the second spacing distance D12 is different from the fifth spacing distance D13. For example, in the embodiment shown in FIGS. 1 to 3, both the first spacing distance D11 and the second spacing distance D12 are different from the fifth spacing distance D13, for example, the first spacing distance D11 is greater than the fifth spacing distance D13, and the fifth spacing distance D13 is greater than the second spacing distance D12.

In some embodiments of the present disclosure, in the third display region 30, the light emitting regions of the first light emitting units 1221 located in the same row of light emitting units 120 are arranged at equal intervals along the first direction X, and the spacing between the light emitting regions of two adjacent first light emitting units 1221 located in the same row of light emitting units 120 in the first direction X is a sixth spacing distance D14. At least one of the first spacing distance D11 and the second spacing distance D12 is different from the sixth spacing distance D14. For example, in the embodiment shown in FIGS. 1 to 3, both the first spacing distance D11 and the second spacing distance and D12 are different from the sixth spacing distance D14, for example, both the first spacing distance D11 and the second spacing distance D12 are smaller than the sixth spacing distance D14.

For example, the sixth spacing distance D14 is greater than the first spacing distance D11, the first spacing distance D11 is greater than the fifth spacing distance D13, and the fifth spacing distance D13 is greater than the second spacing distance D12.

For example, as illustrated by FIGS. 1 to 3, a density of the plurality of first light emitting unit groups 100 in the first display region 10 is a third density, and a density of the plurality of second light emitting unit groups 300 in the second display region 20 is a fourth density, and the third density is greater than the fourth density. In the embodiment of the present disclosure, "the third density is greater than the fourth density" may refer to that the number of the first light emitting unit groups 100 is greater than the number of the second light emitting unit groups 300 in the same area. For example, the same area can be the area of a rectangle, a long edge of which is parallel to the first direction X and a short edge of which is parallel to the second direction Y. For example, the number of second light emitting unit groups 300 in one row can be q, the long edge of the rectangle can be the length of p (p is a positive integer not greater than q) second light emitting unit groups 300 along the second direction Y, and the short edge of the rectangle can be the length of one second light emitting unit group 300 along the first direction X.

For example, a density of the third light emitting unit groups 500 in the third display region 30 is a fifth density, and the density (i.e., the third density) of the first light emitting unit groups 100 in the first display region 10 and the density (i.e., the fourth density) the second light emitting unit groups 300 in the second display region 20 are both greater than the fifth density, the third density is greater than the fourth density, and the fourth density is greater than the fifth density. In the embodiment of the present disclosure, the number of the first light emitting unit groups 100 and the number of the second light emitting unit groups 300 are both greater than the number of the third light emitting unit groups 500 in the same area. In the embodiment of the present disclosure, the density of the first light emitting unit groups 100 in the first display region 10 is greater than the density of the third light emitting unit groups 500 in the third display region 30. By arranging the second display region 20 between the third display region 30 and the first display region 10, and the density of the light emitting unit groups in the second display region 20 between the density of the light emitting unit groups in the first display region 10 and the density of the light emitting unit groups in the third display region 30, edges of the first display region 10 and the third display region 30 which are adjacent to each other can be relatively bright. Furthermore, compared with the case where the first display region 10 is in contact with the third display region 30 (that is, there is no second display region 20 therebetween), the display substrate provided by the embodiment of the present disclosure is beneficial to improve the bluish or dark phenomenon of the junction position between the third display region 30 and the first display region 10, and further improve the display quality of the third display region 30 (for example, the region where the under-screen camera is located).

For example, the ratio of the fifth density to the third density may be 0.1 to 0.5, and the ratio of the fourth density to the third density may be 0.5 to 0.9. For example, the ratio of the fifth density to the third density may be 1/4 and the ratio of the fourth density to the third density may be 1/2.

For example, in the examples shown in FIGS. 1 to 3, the area of the light emitting region of the first light emitting unit 1221 in the third display region 30 is different from the area of the light emitting region of the first light emitting unit 1221 in the first display region 10, and the area of the light emitting region of the first light emitting unit 1221 in the third display region 30 is different from the area of the light emitting region of the first light emitting unit 1221 in the second display region 20.

In other examples of the present disclosure, the area of the light emitting region of the first light emitting unit 1221 in the third display region 30 may be approximately the same as or similar to the area of the light emitting region of the first light emitting unit 1221 in the first display region 10, and the area of the light emitting region of the first light emitting unit 1221 in the third display region 30 may also be approximately the same as or similar to the area of the light emitting region of the first light emitting unit 1221 in the second display region 20.

For example, the ratio of the area of the light emitting region of the first light emitting unit 1221 in the third display region 30 to the area of the light emitting region of the first light emitting unit 1221 in the first display region 10 is 0.8-2.5, for example, it can be further 1.1-2.5, thus improving the uniformity and consistency of the overall light emitting brightness of the first light emitting units 1221 in the first display region 10 and the third display region 30.

For example, the area ratio of the light emitting regions of the same color light emitting units 120 respectively in the third light emitting unit group 500 and the first light emitting unit group 100 is greater than 1. For example, the ratio of the area of the light emitting region of the first light emitting unit 1221 in the third light emitting unit group 500 to the area of the light emitting region of the first light emitting unit 1221 in the first light emitting unit group 100 may be 1.1 to 2.5.

For example, the ratio of the area of the light emitting region of the first light emitting unit 1221 in the third display region 30 to the area of the light emitting region of the first light emitting unit 1221 in the second display region 20 is 0.8-2.5, for example, it can be further 1.1-2.5, thus improving the uniformity and consistency of the overall light emitting brightness of the first light emitting units 1221 in the second display region 20 and the third display region 30.

For example, the area ratio of the light emitting regions of the same color light emitting units 120 respectively in the third light emitting unit group 500 and the second light emitting unit group 300 is greater than 1. For example, the ratio of the area of the light emitting region of the first light emitting unit 1221 in the third light emitting unit group 500 to the area of the light emitting region of the first light emitting unit 1221 in the second light emitting unit group 300 may be 1.1 to 2.5.

For example, the area of the light emitting region of the first light emitting unit 1221 in the second light emitting unit group 300 is less than or equal to the area of the light emitting region of the first light emitting unit 1221 in the third light emitting unit group 500 adjacent to the second light emitting unit group 300.

For example, the area ratio of the light emitting regions of the same light emitting units 120 (for example, the first light emitting units 1221) respectively in the third light emitting unit group 500 and the second light emitting unit group 300 may be 1.3 to 2.2. For example, the area ratio of the light emitting regions of the same light emitting units 120 (for example, the first light emitting units 1221) respectively in the third light emitting unit group 500 and the second light emitting unit group 300 may be 1.5 to 2. For example, the area ratio of the light emitting regions of the same light emitting units 120 (e.g., the first light emitting units 1221) respectively in the third light emitting unit group 500 and the second light emitting unit group 300 may be 1.8.

For example, the area ratio of the light emitting regions of the same light emitting units 120 (for example, the first light emitting units 1221) respectively in the third light emitting unit group 500 and the first light emitting unit group 100 may be 1.3 to 2.2. For example, the area ratio of the light emitting regions of the same light emitting units 120 (for example, the first light emitting units 1221) respectively in the third light emitting unit group 500 and the first light emitting unit group 100 may be 1.5 to 2. For example, the area ratio of the light emitting regions of the same light emitting units 120 (e.g., the first light emitting units 1221) respectively in the third light emitting unit group 500 and the first light emitting unit group 100 may be 1.8.

In some embodiments of the present disclosure, as illustrated by FIGS. 1 to 3, the light emitting units 120 in the light emitting unit group further include a second light emitting unit 121 and a third light emitting unit 123. In each light emitting unit group of the display region 101, the second light emitting unit 121 and the third light emitting unit 123 are located in different rows, for example, in different rows of light emitting units, and the first light emitting unit 1221 and the second light emitting unit 121 are located in the same row, for example, in the same row of light emitting units. For example, in each light emitting unit group of the display region 101, a straight line extending in the first direction X can pass through the first light emitting unit 1221 and the second light emitting unit 121 at the same time, while the second light emitting unit 121 and the third light emitting unit 123 cannot be passed through by any straight line extending in the first direction X at the same time.

For example, as illustrated by FIGS. 1 to 3, each of the first light emitting unit groups 100, each of the second light emitting unit groups 300 and each of the third light emitting unit groups 500 at least includes one first light emitting unit 1221, one second light emitting unit 121 and one third light emitting unit 123, the second light emitting unit 121 and the third light emitting unit 123 are located in different rows, and the first light emitting unit 1221 and the second light emitting unit 121 are arranged along the first direction X.

In some embodiments of the present disclosure, as illustrated by FIGS. 1 to 3, the light emitting units 120 in the light emitting unit group further includes a fourth light emitting unit 1222. For example, as illustrated by FIGS. 2 and 3, in the first display region 10, one row of light emitting units 120 arranged along the first direction X includes the second light emitting unit 121, the first light emitting unit 1221 and the third light emitting unit 123 which are repeatedly arranged in sequence; in the second display region 20, one row of light emitting units 120 arranged along the first direction X may include one row of third light emitting units 123 arranged along the first direction X, or one row of light emitting units 120 arranged along the first direction X may include one row of fourth light emitting units 1222 arranged along the first direction X, or one row of light emitting units 120 arranged along the first direction X may further include a light emitting unit row formed by second light emitting units 121 and first light emitting units 1221 which are alternately arranged in turn along the first direction X.

For example, as illustrated by FIGS. 1 to 3, in the second display region 20, second light emitting units 121 in one row are arranged at equal intervals along the first direction X, fourth light emitting units 1222 in one row are arranged at equal intervals along the first direction X, third light emitting units 123 in one row are arranged at equal intervals along the first direction X, and first light emitting units 1221 in one row are arranged at unequal distances along the first direction X, which is beneficial to manufacturing the other light emitting units 120 in the second light emitting unit group 300, except the first light emitting units 1221.

For example, the first light emitting unit 1221, the second light emitting unit 121 and the third light emitting unit 123 are respectively configured to provide light of different colors, such as red light, green light, blue light and the like, so that each light emitting unit group can include at least one selected from the group consisting of a light emitting unit 120 emitting red light, a light emitting unit 120 emitting green light and a light emitting unit 120 emitting blue light.

The embodiment of the present disclosure schematically shows that the second light emitting unit 121 may be a red light emitting unit, the first light emitting unit 1221 may be a green light emitting unit, and the third light emitting unit 123 may be a blue light emitting unit. It should be noted that the embodiment of the present disclosure includes, but is not limited thereto. The embodiment of the present disclosure does not particularly limit colors of the light emitting of the first light emitting unit 1221, the second light emitting unit 121 and the third light emitting unit 123. For example, the first light emitting unit 1221 may be a blue light emitting unit or a red light emitting unit, the second light emitting unit 121 may be a blue light emitting unit or a green light emitting unit, and the third light emitting unit 123 may be a red light emitting unit or a green light emitting unit.

For example, the first light emitting unit 1221 and the fourth light emitting unit 1222 in each light emitting unit group are configured to provide light of the same color.

For example, as illustrated by FIGS. 2 and 3, in the first display region 10, a row of light emitting units 120 arranged along the first direction X may include a second light emitting unit 121, a first light emitting unit 1221 and a third light emitting unit 123, and may also include a second light emitting unit 121, a fourth light emitting unit 1222 and a third light emitting unit 123, and the first light emitting units 1221 and the fourth light emitting units 1222 may be arranged along the second direction Y.

For example, as illustrated by FIGS. 1 to 3, the second light emitting unit group 300 in the second display region 20 may include three rows of light emitting units, which may include a row of third light emitting units 123, a row of fourth light emitting units 1222, and a row of light emitting units including second light emitting units 121 and first light emitting units 1221 which are alternately arranged.

For example, as illustrated by FIGS. 1 to 3, in the third display region 30, a row of light emitting units 120 arranged along the first direction X includes a row of third light emitting units 123, a row of fourth light emitting units 1222, or a row of light emitting units including second light emitting units 121 and first light emitting units 1221 which are alternately arranged. For example, at least one light emitting unit group 500 in the third display region 30 may include three rows of light emitting units, which may include a row of third light emitting units 123, a row of fourth light emitting units 1222, and a row of light emitting units including second light emitting units 121 and first light emitting units 1221 which are alternately arranged.

For example, the arrangement law of different light emitting units 120 in the second light emitting unit group 300 may be the same as or similar to that of different light emitting units 120 in the third light emitting unit group 500.

For example, as illustrated by FIGS. 1 to 3, in the third display region 30, the first light emitting units 1221 and the fourth light emitting units 1222 are arranged along the second direction Y, and some of the first light emitting units 1221 in the second display region 20 and the fourth light emitting units 1222 in the third display region 30 may be roughly arranged along the second direction Y.

For example, a plurality of third light emitting unit groups 500 are arranged into a plurality of rows of third light emitting unit groups 500, two adjacent rows of third light emitting unit groups 500 are staggered along a row direction (for example, the first direction X), and a plurality of second light emitting unit groups 300 are arranged into at least one row of second light emitting unit groups 300, for example, the second light emitting unit groups 300 are arranged into one row of second light emitting unit groups 300.

For example, the third light emitting unit group 500 located in one of an odd-numbered row and an even-numbered row is located in the same column as the odd-numbered second light emitting unit group 300, and the third light emitting unit group 500 located in the other of the odd-numbered row and the even-numbered row is located in the same column as the even-numbered second light emitting unit group 300. The second light emitting unit group 300 and the third light emitting unit group 500 located in the same column in the embodiment of the present disclosure refers to the second light emitting unit group 300 and the third light emitting unit group 500 in which the first light emitting unit 1221 in the second light emitting unit group 300 and the fourth light emitting unit 1222 in the third light emitting unit group 500 are located in the same column (i.e., arranged along the column direction, for example, along the second direction Y).

For example, as illustrated by FIGS. 2 and 3, a side of the second display region 20 close to the first display region 10 is provided with a protruding region, and a side of the first display region 10 close to the second display region 20 is provided with a concave region. The protruding region of the second display region 20 can be inserted into the concave region of the first display region 10, and a row of fourth light emitting units 1222 in the second display region 20 can be located in the protruding region of the second display region 20, that is, in the concave region of the first display region 10. A row of fourth light emitting units 1222 in the second display region 20 may be located in the same row as the light emitting units 120 (e.g., the second light emitting unit 121 and the third light emitting unit 123) in the first display region 10. Herein, "a row of fourth light emitting units 1222 in the second display region 20 can be located in the same row as the light emitting units 120 in the first display region 10" refers to that a straight line extending parallel to the row direction (for example, the first direction X) can pass through the fourth light emitting units 1222 in the second display region 20 and the light emitting units 120 in the first display region 10.

For example, a side of the third display region 30 close to the second display region 20 is provided with a protruding region, and a side of the second display region 20 close to the third display region 30 is provided with a concave region. The protruding region of the third display region 30 can be inserted into the concave region of the second display region 20, and a row of fourth light emitting units 1222 in the third display region 30 can be located in the protruding region of the third display region 30, that is, in the concave region of the second display region 20, then a row of fourth light emitting units 1222 in the third display region 30 can be located in the same row as the light emitting units 120 in the second display region 20.

For example, as illustrated by FIGS. 2 and 3, in the first display region 10, the first light emitting units 1221 and the fourth light emitting units 1222 are arranged along the second direction Y, and the fourth light emitting units 1222 in the second display regions 20 may be roughly arranged along the second direction Y with the first light emitting units 1221 or the fourth light emitting units 1222 in the first display region 10, while the first light emitting units 1221 in the second display region 20 may be roughly arranged along the second direction Y with the first light emitting units 1221 or the fourth light emitting units 1222 in the first display region 10, and may offset from the first light emitting units 1221 or the fourth light emitting units 1222 in the first display region 10 by a certain distance in the first direction X.

For example, as illustrated by FIGS. 1 to 3, the plurality of first light emitting unit groups 100 include a plurality of columns of third sub light emitting unit groups 111 and a plurality of columns of fourth sub light emitting unit groups 112, the plurality of columns of third sub light emitting unit groups 111 and the plurality of columns of fourth sub light emitting unit groups 112 are alternately arranged along the row direction (e.g., the first direction X). For example, the second light emitting unit 121, the third light emitting unit 123 and the first light emitting unit 1221 (or the fourth light emitting unit 1222) in the second light emitting unit group 300 are located in the same column as the third sub light emitting unit group 111. The above-mentioned "the second light emitting unit 121, the third light emitting unit 123 and the first light emitting unit 1221 (or the fourth light emitting unit 1222) in the second light emitting unit group 300 are located in the same column as the third sub light emitting unit group 111" may refer to that the second light emitting units 121 in the second light emitting unit group 300 and the second light emitting units 121 in the third sub light emitting unit group 111 are roughly arranged along the column direction (for example, the second direction Y), the third light emitting unit 123 in the second light emitting unit group 300 and the third light emitting unit 123 in the third sub light emitting unit group 111 are arranged in the column direction, and the fourth light emitting unit 1222 in the second light emitting unit group 300 and the first light emitting unit 1221 in the third sub light emitting unit group 111 are roughly arranged in the column direction.

For example, as illustrated by FIGS. 1 to 3, the plurality of second light emitting unit groups 300 include first sub light emitting unit groups 310 and second sub light emitting unit groups 320 alternately arranged along the first direction X, and at least one third light emitting unit group 500 in a row of third light emitting unit groups 500, in the plurality of third light emitting unit groups 500, adjacent to the plurality of second light emitting unit groups 300 is located in the same column as the second sub light emitting unit groups 320. For example, the third light emitting unit group 500 adjacent to the second light emitting unit group 300 is located in the same column as the second light emitting unit group 300. For example, the fourth light emitting unit 1222 in the third light emitting unit group 500 adjacent to the second light emitting unit group 300 is located in the same row as the second light emitting unit 121 in the second light emitting unit group 300.

For example, as illustrated by FIGS. 1 to 3, in the first display region 10, a row of light emitting units 120 arranged along the first direction X includes light emitting units 120 of N different colors; in the second display region 20, a row of light emitting units 120 arranged along the first direction X includes light emitting units 120 of M different colors, where N is greater than M, and both N and M are positive integers not less than 1.

For example, as illustrated by FIGS. 2 and 3, in the first display region 10, a row of light emitting units 120 arranged along the first direction X includes light emitting units 120 of three different colors, such as a first light emitting unit 1221, a second light emitting unit 121 and a third light emitting unit 123; in the second display region 20, a row of light emitting units 120 arranged along the first direction X includes light emitting units 120 of one color or light emitting units 120 of two different colors, and the light emitting units 120 of two different colors are alternately arranged along the first direction X. For example, N can be 3 and M can be 1 or 2. It should be noted that the embodiment of the present disclosure includes, but is not limited thereto. A row of light emitting units arranged along the first direction X in the first display region 10 may also include light emitting units 120 of two different colors, or light emitting units 120 of four or more different colors. The embodiment of the present disclosure is not limited thereto.

In some embodiments of the present disclosure, the first display region 10 further includes a plurality of first pixel circuit groups 200 connected with the plurality of first light emitting unit groups 100, the second display region 20 further includes a plurality of second pixel circuit groups 400 connected with the plurality of second light emitting unit groups 300, and the third display region 30 further includes a plurality of third pixel circuit groups 600 connected with the plurality of third light emitting unit groups 500. For example, the plurality of first pixel circuit groups 200 are connected with the plurality of first light emitting unit groups 100 in one-to-one correspondence. For example, the plurality of second pixel circuit groups 400 are connected with the plurality of second light emitting unit groups 300 in one-to-one correspondence. For example, the plurality of third pixel circuit groups 600 are connected with the plurality of third light emitting unit groups 500 in one-to-one correspondence.

For example, the first pixel circuit group 200, the second pixel circuit group 400 and the third pixel circuit group 600 are all located on the base substrate 01. The drawing schematically shows that the orthographic projections of the first light emitting unit group 100 and the first pixel circuit group 200 connected with first light emitting unit group 100 on the base substrate 01 overlap with each other, the orthographic projections of the second light emitting unit group 300 and the second pixel circuit group 400 connected with the second light emitting unit group 300 on the base substrate 01 overlap with each other, and the orthographic projections of the third light emitting unit group 500 and the third pixel circuit group 600 connected with the third light emitting unit group 500 on the base substrate 01 overlap with each other, but it is not limited thereto, the light emitting unit group and the pixel circuit group connected with the light emitting unit group do not overlap with each other.

In other embodiments of the present disclosure, the plurality of third pixel circuit groups 600 may also be located in regions other than the third display region 30. Therefore, by arranging the third pixel circuit groups 600, driving the third light emitting unit groups 500 in the third display region 30 to emit light, in the regions other than the third display region 30, the light transmittance of the third display region 30 can be improved, that is, the light emitting unit 120 and the pixel circuit are separately arranged to improve the light transmittance of the third display region 30. For example, the third display region 30 is a region for arranging, for example, an under-screen camera. Of course, the embodiment of the present disclosure is not limited to arranging, for example, a front camera module at a side of the base substrate 01 in the third display region 30 away from the light emitting unit 120, but may also adopt, for example, a 3D structured light module (for example, a 3D structured light sensor), a time-of-flight 3D imaging module (for example, a time-of-flight sensor), an infrared sensing module (for example, an infrared sensor), and the like.

In some embodiments of the present disclosure, as illustrated by FIG. 1, the display substrate further includes a transition region 40 located between the first display region 10 and the third display region 30, and the transition region 40 includes two parts located at both sides of the third display region 30 in the first direction X. The transition region 40 includes a plurality of fourth light emitting unit groups 700 and a plurality of fourth pixel circuit groups 800 connected with the fourth light emitting unit groups 700, for example, the plurality of fourth pixel circuit groups 800 are connected with the plurality of fourth light emitting unit groups 700 in one-to-one correspondence. For example, the transition region 40 further includes a third pixel circuit group 600 connected with the third light emitting unit group 500. In the embodiment of the present disclosure, each light emitting unit 120 and the pixel circuit connected with the light emitting unit 120 constitute a sub-pixel, that is, the display substrate includes a plurality of sub-pixels, and each sub-pixel includes the light emitting unit 120 and the pixel circuit connected with the light emitting unit 120.

For example, as illustrated by FIGS. 1 to 3, in at least one second light emitting unit group 300 adjacent to the first light emitting unit group 100, the distance in the second direction Y between the light emitting region of the first light emitting unit 1221 and the light emitting region of the fourth light emitting unit 1222 is a first distance D1, and the embodiment of the present disclosure schematically shows the distance between the edges of the light emitting regions of two light emitting units 120 which are adjacent to each other in the second direction Y, or the distance between two points of the light emitting regions of two light emitting units 120 which are adjacent to each other in the second direction Y. However, the embodiment of the present disclosure is not limited thereto, and the first distance D1 may also refer to the distance between the centers of the light emitting regions of the two light emitting units 120 in the second direction Y, that is, the distance between two straight lines passing through the centers of the light emitting regions of the two light emitting units 120 and extending along the first direction X, for example, the first direction X is perpendicular to the second direction Y. The distance in the second direction Y between the light emitting region of the fourth light emitting unit 1222 in the second light emitting unit group 300 adjacent to the first light emitting unit group 100 and the light emitting region of the first light emitting unit 1221 in the first light emitting unit group 100 which is adjacent to the fourth light emitting region as mentioned above is the second distance D2. The embodiment of the present disclosure schematically shows the distance in the second direction Y between the edges of the light emitting regions of the two light emitting units 120 which are adjacent to each other. However, the embodiment of the present disclosure is not limited thereto, and the second distance D2 as mentioned above may also refer to the distance between the centers of the light emitting regions of the two light emitting units 120 in the second direction Y, that is, the distance between two straight lines passing through the centers of the light emitting regions of the two light emitting units 120 respectively and extending in the first direction X. For example, the first distance D1 may be greater than the second distance D2.

It should be noted that the above-mentioned first distance D1 and second distance D2 are both under the same definition, that is, they can both be the distance in the first direction X or the second direction Y between the edges of the light emitting regions of two light emitting units 120, or the distance between the centers of the light emitting regions of two light emitting units 120 in the first direction X or the second direction Y, etc.

For example, as illustrated by FIGS. 2 and 3, the fourth light emitting unit 1222 in the second light emitting unit group 300 is located in the same row as the light emitting unit 120 in the first light emitting unit group 100, and the fourth light emitting unit 1222 is closer to the first light emitting unit 1221 in the first light emitting unit group 100 than the first light emitting unit 1221 in the same second light emitting unit group 300 as the fourth light emitting unit 1222.

For example, as illustrated by FIGS. 2 and 3, the first distance D1 is greater than a size of the light emitting region of the third light emitting unit 123 in the second light emitting unit group 300 in the second direction Y. For example, as illustrated by FIGS. 2 and 3, in the second light emitting unit group 300, the third light emitting unit 123 may be located between the first light emitting unit 1221 and the fourth light emitting unit 1222.

For example, as illustrated by FIGS. 2 and 3, the second distance D2 is smaller than the size of the light emitting region of the third light emitting unit 123 in the second light emitting unit group 300 in the second direction Y. For example, as illustrated by FIGS. 2 and 3, the second distance D2 is smaller than the size of the light emitting region of the third light emitting unit 123 in the first light emitting unit group 100 in the second direction Y. For example, the size of the light emitting region of the third light emitting unit 123 in the first light emitting unit group 100 in the second direction Y may be approximately equal to the size of the light emitting region of the third light emitting unit 123 in the second light emitting unit group 300 in the second direction Y. For example, "approximately equal" in the present disclosure refers to that the ratio of the difference between the two values to one of the two values is not greater than 0.2.

For example, as illustrated by FIGS. 1 to 3, in each second light emitting unit group 300, the first light emitting unit 1221 or the fourth light emitting unit 1222 is located at the same row as the second light emitting unit 121. For example, as illustrated by FIGS. 1 to 3, in the second light emitting unit group 300 adjacent to the first light emitting unit group 100, the fourth light emitting unit 1222 is located in the same row as the second light emitting unit 121 and the third light emitting unit 123 in the first light emitting unit group 100. For example, the fourth light emitting unit 1222 in the second light emitting unit group 300 is located in the same row as the second light emitting unit 121 and the third light emitting unit 123 in the first light emitting unit group 100.

The embodiment of the present disclosure only schematically shows a row of second light emitting unit groups 300 adjacent to the first light emitting unit group 100, and the embodiment of the present disclosure is not limited to only including this row of second light emitting unit groups 300. For example, the second display region 20 may include a plurality of rows of second light emitting unit groups 300, among other second light emitting unit groups 300 except the second light emitting unit groups 300 adjacent to the first light emitting unit groups 100, the first light emitting unit 1221 is located in the same row as the second light emitting unit 121, and the fourth light emitting unit 1222 is located in the same row as the second light emitting unit 121 and the third light emitting unit 123 in another second light emitting unit group 300 (the second light emitting unit group is the second light emitting unit group adjacent to the "other second light emitting unit groups" in the second direction Y).

For example, as illustrated by FIGS. 1 to 3, the number of one row of light emitting units 120 arranged in the first direction X in the first display region 10 is greater than the number of one row of light emitting units 120 arranged in the first direction X in the second display region 20. For example, as illustrated by FIGS. 1 to 3, an average distance between the light emitting regions of two adjacent light emitting units 120 located in the same row in the first display region 10 is a, and an average distance between the light emitting regions of two adjacent light emitting units 120 located in any row in the second display region 20 is b, and a is smaller than b.

For example, as illustrated by FIGS. 1 to 3, in at least one of the first light emitting units group 100, the distance between the light emitting region of the second light emitting unit 121 and the light emitting region of the first light emitting unit 1221 is a third distance D3; in at least one first sub light emitting unit group 310, the distance between the light emitting region of the second light emitting unit 121 and the light emitting region of the first light emitting unit 1221 is a fourth distance D4; in at least one second sub light emitting unit group 320, the distance between the light emitting region of the second light emitting unit 121 and the light emitting region of the first light emitting unit 1221 is a fifth distance D5, the fifth distance D5 is greater than the fourth distance D4, and the fourth distance D4 is greater than the third distance D3. For example, the fifth distance D5 may be 50 to 60 microns, the fourth distance D4 may be 28 to 35 microns, and the third distance D3 may be 20 to 27 microns.

For example, as illustrated by FIGS. 1 to 3, in at least one first sub light emitting unit group 310, the distance between two center lines extending in the second direction Y of the light emitting region of the first light emitting unit 1221 and the light emitting region of the fourth light emitting unit 1222 is a sixth distance D6; in at least one second sub light emitting unit group 320, the distance between two center lines extending in the second direction Y of the light emitting region of the first light emitting unit 1221 and the light emitting region of the fourth light emitting unit 1222 is a seventh distance D7, and the seventh distance D7 is greater than the sixth distance D6.

For example, as illustrated by FIGS. 1 to 3, in at least one first sub light emitting unit group 310, the distance between a center line extending in the second direction Y in the light emitting region of the second light emitting unit 121 and a center line extending in the second direction Y in the light emitting region of the fourth light emitting unit 1222 is an eighth distance D8; in at least one second sub light emitting unit group 320, the distance between a center line extending in the second direction Y in the light emitting region of the second light emitting unit 121 and a center line extending in the second direction Y in the light emitting region of the fourth light emitting unit 1222 is a ninth distance D9, and the ratio of the ninth distance D9 to the eighth distance D8 is 0.8 to 1.2.

For example, as illustrated by FIGS. 1 to 3, the light emitting region of the second light emitting unit 121 in the first light emitting unit group 100 and the light emitting region of the second light emitting unit 121 in the second light emitting unit group 300 are approximately the same in shape and area; the light emitting region of the third light emitting unit 123 in the first light emitting unit group 100 and the light emitting region of the third light emitting unit 123 in the second light emitting unit group 300 are approximately the same in shape and area. For example, in the first light emitting unit group 100, the shapes of the light emitting regions of the second light emitting unit 121 and the third light emitting unit 123 include hexagons; in the second light emitting unit group 300, the shapes of the light emitting regions of the second light emitting unit 121 and the third light emitting unit 123 include hexagons.

For example, in each light emitting unit group, the area of the light emitting region of the third light emitting unit 123 is greater than the area of the light emitting region of the second light emitting unit 121.

For example, as illustrated by FIGS. 1 to 3, the shape of the light emitting region of the first light emitting unit 1221 in the first light emitting unit group 100 is different from the shape of the first light emitting unit 1221 in the second light emitting unit group 300, and the shape of the light emitting region of the fourth light emitting unit 1222 in the first light emitting unit group 100 is different from the shape of the fourth light emitting unit 1222 in the second light emitting unit group 300. For example, the shapes of the first light emitting unit 1221 and the fourth light emitting unit 1222 in the first light emitting unit group 100 may both be pentagonal, and the shapes of the first light emitting unit 1221 and the fourth light emitting unit 1222 in the second light emitting unit group 300 may both be roughly rectangular, thus preventing the second electrode of the third light emitting unit 123 and the second electrode of the fourth light emitting unit 1222 in the second light emitting unit group 300 from spatially conflicting and preventing the second electrode of the second light emitting unit 121 and the second electrode of the first light emitting unit 1221 in the second light emitting unit group 300 from spatially conflicting.

For example, the area of the light emitting region of the first light emitting unit 1221 in the first light emitting unit group 100 is different from the area of the light emitting region of the first light emitting unit 1221 in the second light emitting unit group 300. For example, the area of the light emitting region of the first light emitting unit 1221 in the first light emitting unit group 100 is greater than the area of the light emitting region of the first light emitting unit 1221 in the second light emitting unit group 300.

For example, the area of the light emitting region of the fourth light emitting unit 1222 in the first light emitting unit group 100 is different from the area of the light emitting region of the fourth light emitting unit 1222 in the second light emitting unit group 300. For example, the area of the light emitting region of the fourth light emitting unit 1222 in the first light emitting unit group 100 is greater than the area of the light emitting region of the fourth light emitting unit 1222 in the second light emitting unit group 300.

For example, as illustrated by FIGS. 1 to 3, in the first light emitting unit group 100 and the third light emitting unit group 500, the shapes of the light emitting regions of the same light emitting units 120 (for example, light emitting units 120 emitting the same color light) are different. For example, in some embodiments of the present disclosure, in the third light emitting unit group 500, the shape of the light emitting region of each light emitting unit 120 includes a circle, an ellipse or a drop shape. The above-mentioned circle includes a standard circle and an approximate circle, and the approximate circle may include an approximate circle with a notch at its edge, an approximate circle with diameters in all directions satisfying a ratio from 0.9 to 1.1, and the like. The above-mentioned ellipses include a standard ellipse and an approximate ellipse, and the approximate ellipse may include an approximate ellipse with a notch at its edge, an approximate ellipse with diameters in all directions satisfying a ratio from 0.9 to 1.1.

For example, in some embodiments of the present disclosure, in the third light emitting unit group 500, the shapes of the light emitting regions of the second light emitting unit 121 and the third light emitting unit 123 are both circles, and the shapes of the light emitting regions of the first light emitting unit 1221 and the fourth light emitting unit 1222 are both ellipses, and the long axis of the ellipses extends along the first direction X.

For example, an edge of the opening of the pixel defining layer for defining the light emitting region of each light emitting unit 120 in the third light emitting unit group 500 includes a protrusion, and the light emitting layer formed in the opening includes a notch, that is, the light emitting region includes a notch where a portion of the second electrode of the light emitting unit 120 is connected with a thin film transistor.

In other embodiments of the present disclosure, in the first light emitting unit group 100 and the third light emitting unit group 500, the shapes of the light emitting regions of the same light emitting units 120 (for example, the light emitting units 120 emitting the same color light) may also be different.

For example, the plurality of first pixel circuit groups 200 as mentioned above include a plurality of first pixel circuits 210, and the plurality of second pixel circuit groups 400 as mentioned above include a plurality of second pixel circuits 410. For example, in at least one second pixel circuit group 400, each second pixel circuit 410 includes two sub-pixel circuits 411 and 412, and the two sub-pixel circuits 411 and 412 are configured to be connected with the same light emitting unit 120 (such as the first light emitting unit 1221, the second light emitting unit 121, the third light emitting unit 123 or the fourth light emitting unit 1222), for example, the two sub-pixel circuits 411 and 412 are connected with the second electrode of the same light emitting unit 120. For example, in the first pixel circuit group 200, each first pixel circuit 210 includes one sub-pixel circuit, and different sub-pixel circuits are configured to be connected with different light emitting units 120, that is, one sub-pixel circuit is only connected with the second electrode of one light emitting unit 120. For example, the sub-pixel circuit included in the second pixel circuit 410 may have the same structure as the sub-pixel circuit included in the first pixel circuit 210.

Figure 4:
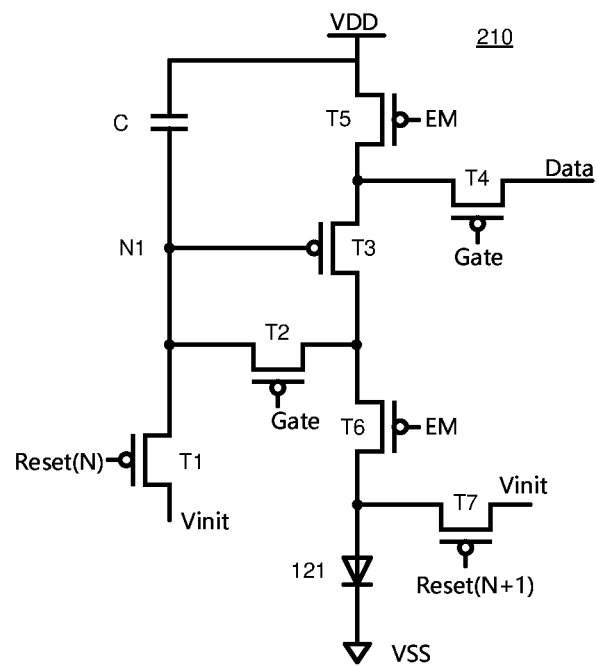
FIG. 4 is an equivalent circuit diagram of a sub-pixel circuit included in one first pixel circuit provided by at least one embodiment of the present disclosure.

For example, FIG. 4 is an equivalent circuit diagram of a sub-pixel circuit included in a first pixel circuit provided in at least one embodiment of the present disclosure. The case where the first pixel circuit 210 shown in FIG. 4 is used for driving the first light emitting unit 1221 is taken as an example, the equivalent circuit diagram of the first pixel circuit 210 driving other light emitting units is basically the same as the equivalent circuit diagram shown in FIG. 4. As illustrated by FIG. 4, the first pixel circuit 210 includes a second reset transistor T1, a second light emission control transistor T5, a first light emission control transistor T6, a data writing transistor T4, a driving transistor T3, a threshold compensation transistor T2, a first reset control transistor T7, and a storage capacitor C. For example, the display substrate further includes a reset power signal line, a scanning signal line, a power signal line, a reset control signal line, a light emission control signal line, and a data line.

For example, the first electrode of the threshold compensation transistor T2 is connected with the first electrode of the driving transistor T3, and the second electrode of the threshold compensation transistor T2 is connected with the gate electrode of the driving transistor T3; the first electrode of the first reset control transistor T7 is connected with the reset power signal line to receive the reset signal Vinit, and the second electrode of the first reset control transistor T7 is connected with the second electrode of the light emitting unit 120 (for example, the first light emitting unit 1221); the first electrode of the data writing transistor T4 is connected with the second electrode of the driving transistor T3, the second electrode of the data writing transistor T4 is connected with the data line to receive a data signal Data, and the gate electrode of the data writing transistor T4 is electrically connected with the scanning signal line to receive a scanning signal Gate; the first electrode of the storage capacitor C is electrically connected with the power signal line, and the second electrode of the storage capacitor C is electrically connected with the gate electrode of the driving transistor T3; the gate electrode of the threshold compensation transistor T2 is electrically connected with the scanning signal line to receive a compensation control signal; the gate electrode of the first reset transistor T7 is electrically connected with the reset control signal line to receive a reset control signal Reset (N+1); the first electrode of the second reset transistor T1 is electrically connected with the reset power signal line to receive the reset signal Vinit, the second electrode of the second reset transistor T1 is electrically connected with the gate electrode of the driving transistor T3, and the gate electrode of the second reset transistor T1 is electrically connected with the reset control signal line to receive the reset control signal Reset (N); the gate electrode of the first light emission control transistor T6 is electrically connected with the light emission control signal line to receive a light emission control signal EM; the first electrode of the second light emitting control transistor T5 is electrically connected with the power signal line to receive a first power signal VDD, the second electrode of the second light emitting control transistor T5 is electrically connected with the second electrode of the driving transistor T3, the gate electrode of the second light emitting control transistor T5 is electrically connected with the light emitting control signal line to receive the light emitting control signal EM, and the first electrode of the light emitting unit 120 (for example, the first light emitting unit 1221) is connected with a voltage terminal VSS. The above-mentioned power signal line refers to a signal line that outputs a voltage signal VDD, and can be connected with a voltage source to output a constant voltage signal, such as a positive voltage signal.

For example, the scanning signal and the compensation control signal may be the same, that is, the gate electrode of the data writing transistor T3 and the gate electrode of the threshold compensation transistor T2 may be electrically connected with the same signal line to receive the same signal, thereby reducing the number of signal lines. For example, the gate electrode of the data writing transistor T3 and the gate electrode of the threshold compensation transistor T2 can also be electrically connected with different signal lines, that is, the gate electrode of the data writing transistor T3 is electrically connected with a first scanning signal line, and the gate electrode of the threshold compensation transistor T2 is electrically connected with a second scanning signal line, and the signals transmitted by the first scanning signal line and the second scanning signal line can be the same or different, so that the gate electrode of the data writing transistor T3 and the threshold compensation transistor T2 can be separately and independently controlled, thus increasing the flexibility of controlling the pixel circuit.

For example, light emission control signals input to the first light emission control transistor T6 and the second light emission control transistor T5 may be the same, that is, the gate electrode of the first light emission control transistor T6 and the gate electrode of the second light emission control transistor T5 may be electrically connected with the same signal line to receive the same signal, thereby reducing the number of signal lines. For example, the gate electrode of the first light emission control transistor T6 and the gate electrode of the second light emission control transistor T5 may be electrically connected with different light emission control signal lines, and the signals transmitted by different light emission control signal lines may be the same or different.

For example, reset control signals input to the first reset transistor T7 and the second reset transistor T1 may be the same, that is, the gate electrode of the first reset transistor T7 and the gate electrode of the second reset transistor T1 may be electrically connected with the same signal line to receive the same signal, thereby reducing the number of signal lines. For example, the gate electrode of the first reset transistor T7 and the gate electrode of the second reset transistor T1 may be electrically connected with different reset control signal lines, and the signals on different reset control signal lines may be the same or different.

For example, as illustrated by FIG. 4, upon the display substrate being in operation, in a first stage of image display, the second reset transistor T1 is turned on to initialize the voltage of a N1 node; in a second stage of image display, data is stored at the N1 node through the data writing transistor T4, the driving transistor T3 and the threshold compensation transistor T2; in a third light emitting stage, the second light emitting control transistor T5, the driving transistor T3 and the first light emitting control transistor T6 are all turned on, and the light emitting unit 120 is driven to emit light.

It should be noted that, in the embodiment of the present disclosure, the pixel circuit of the sub-pixel can be a structure including other numbers of transistors or capacitors, such as a 7T2C structure, a 6T1C structure, a 6T2C structure or a 9T2C structure, in addition to the 7T1C structure shown in FIG. 4, and the embodiment of the present disclosure is not limited thereto.

Figure 5:
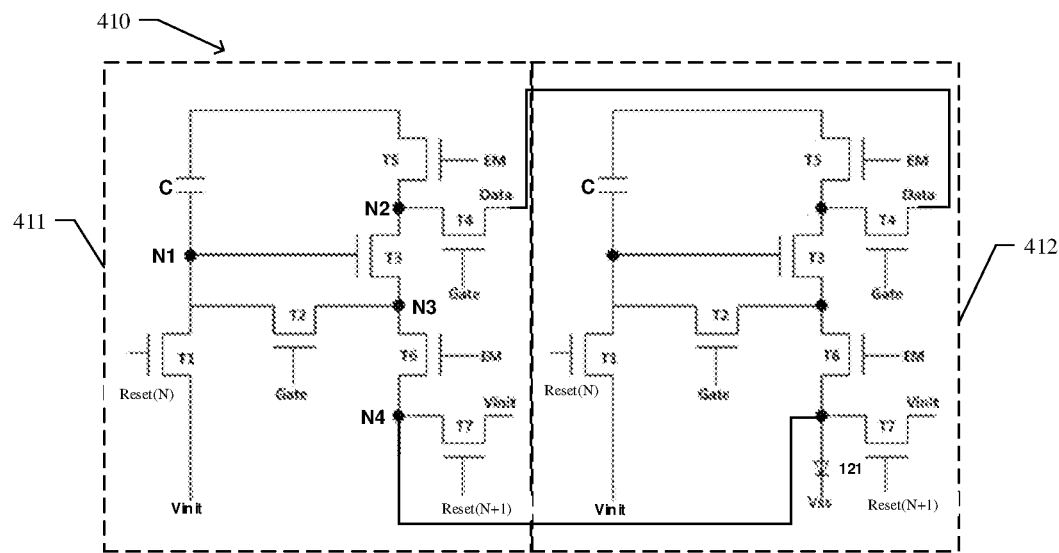
FIG. 5 is an equivalent circuit diagram of two sub-pixel circuits included in one second pixel circuit provided by at least one embodiment of the present disclosure.

For example, FIG. 5 is an equivalent circuit diagram of two sub-pixel circuits included in a second pixel circuit provided in at least one embodiment of the present disclosure. The case where the second pixel circuit 410 shown in FIG. 5 is used for driving the first light emitting unit 1221 is taken as an example, the equivalent circuit diagram of the second pixel circuit 410 driving other light emitting units is basically the same as the equivalent circuit diagram shown in FIG. 5. As illustrated by FIG. 5, the equivalent circuit diagram of any one of the two sub-pixel circuits 411 and 412 in the second pixel circuit 410 is basically the same as the equivalent circuit diagram of the first pixel circuit 210 shown in FIG. 4, for example, both of two sub-pixel circuits 411 and 412 have a 7T1C structure. In the second pixel circuit 410, the data writing transistors T4 of the two sub-pixel circuits are connected, and the N4 nodes of the two sub-pixel circuits are connected to jointly drive the same light emitting unit 120 to emit light.

For example, as illustrated by FIG. 5, upon the display substrate being in operation, in the first stage of image display, the second reset transistor T1 is turned on to initialize the voltage of the N1 node; in the second stage, the same data signal Data is stored in two N1 nodes of two pixel circuits through two connected data writing transistors T4, and two driving transistors T3 and two threshold compensation transistors T2 respectively connected with the two connected data writing transistors T4; in the third light emitting stage, the second light emitting control transistors T5, the driving transistors T3 and the first light emitting control transistors T6 in the two sub-pixel circuits 411 and 412 are all turned on to transmit the same data signals to the two N4 nodes. At this time, the N4 nodes of the two sub-pixel circuits 411 and 412 are connected to jointly drive the same light emitting unit 120 (for example, the first light emitting unit 1221) to emit light. In the embodiment of the present disclosure, the second pixel circuit in the second display region 20 adopts the design of double 7T1C, which can achieve the purpose of increasing current and brightness.

For example, the third pixel circuit groups include a plurality of third pixel circuits, and the fourth pixel circuit groups include a plurality of fourth pixel circuits, the third pixel circuit and the fourth pixel circuit may have the same equivalent circuit diagram as the first pixel circuit or the same equivalent circuit diagram as the second pixel circuit. For example, in an example of the present disclosure, the third pixel circuit and the fourth pixel circuit both have the same equivalent circuit diagram as the second pixel circuit, the third pixel circuit and the fourth pixel circuit each includes two sub-pixel circuits, which are configured to be connected with the same light emitting unit 120 (such as the first light emitting unit 1221, the second light emitting unit 121, the third light emitting unit 123 or the fourth light emitting unit 1222), for example, the two sub-pixel circuits are connected with the second electrode of the same light emitting unit 120, thereby achieving the purposes of increasing current and brightness.

Figure 6:
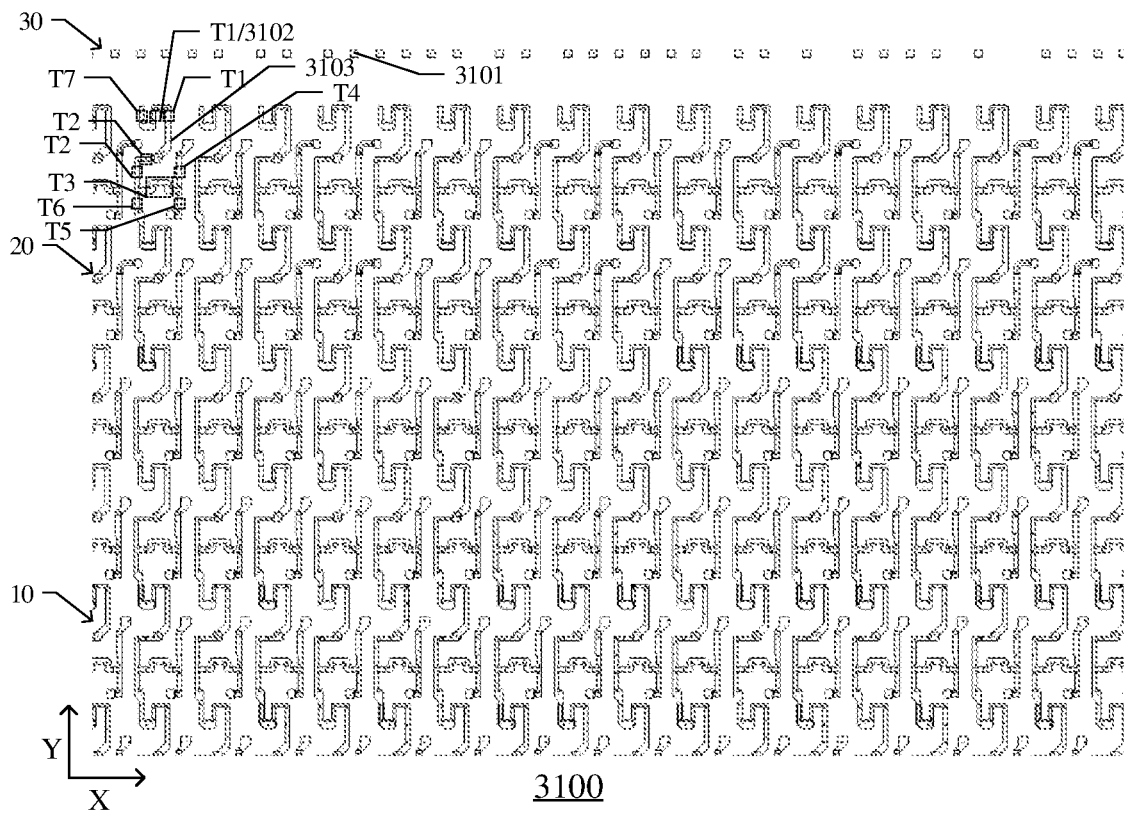
FIG. 6 is a schematic diagram of a partial plane structure of an active semiconductor layer at a junction position of a third display region and a second display region and at a junction position of a first display region and a second display region provided by at least one embodiment of the present disclosure.
Figure 7:
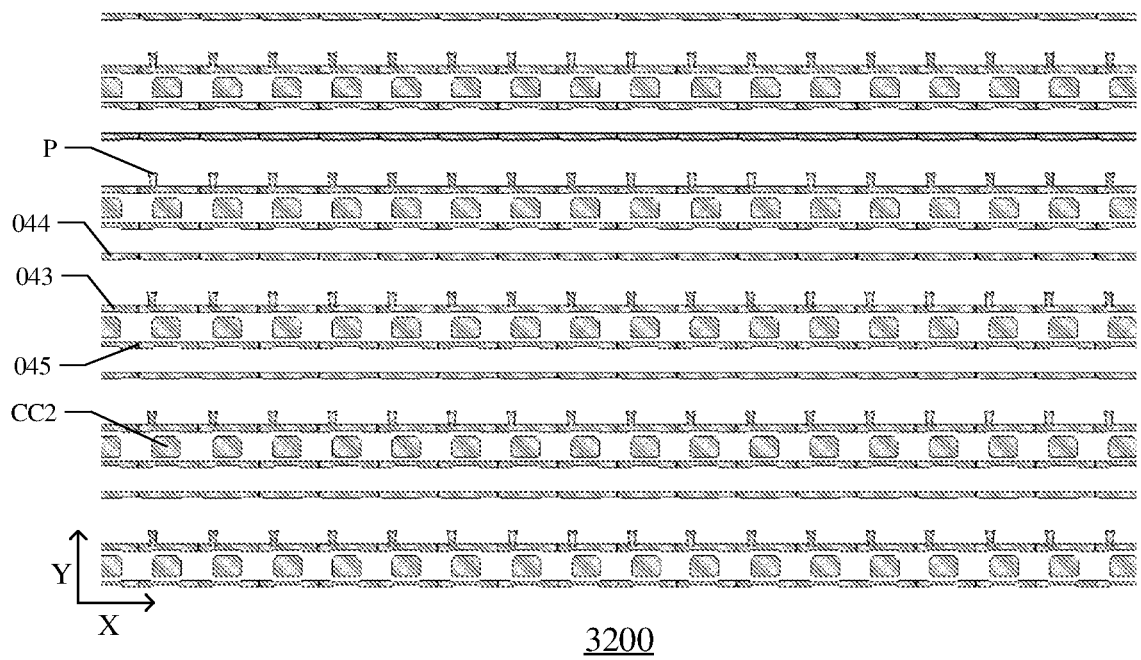
FIG. 7 is a schematic diagram of a partial plane structure of a first conductive layer at a junction position between a third display region and a second display region and at a junction position of a first display region and a second display region provided by at least one embodiment of the present disclosure.
Figure 8:
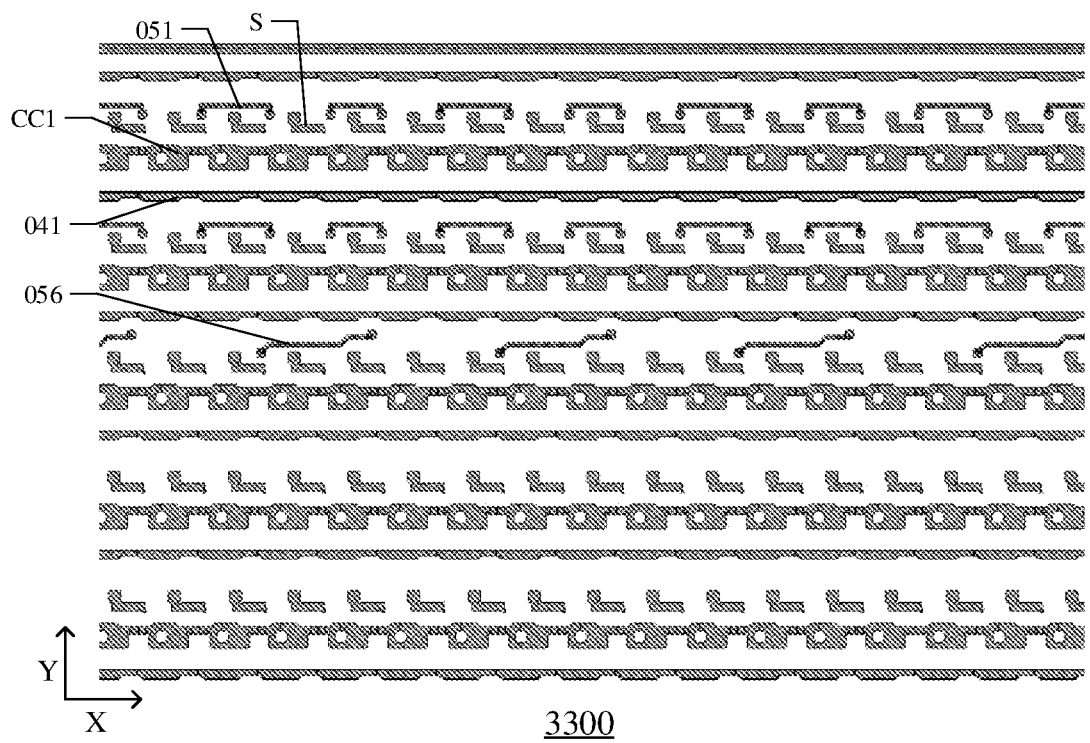
FIG. 8 is a schematic diagram of a partial plane structure of a second conductive layer at a junction position of a third display region and a second display region and at a junction position of a first display region and a second display region provided in at least one embodiment of the present disclosure.
Figure 9:
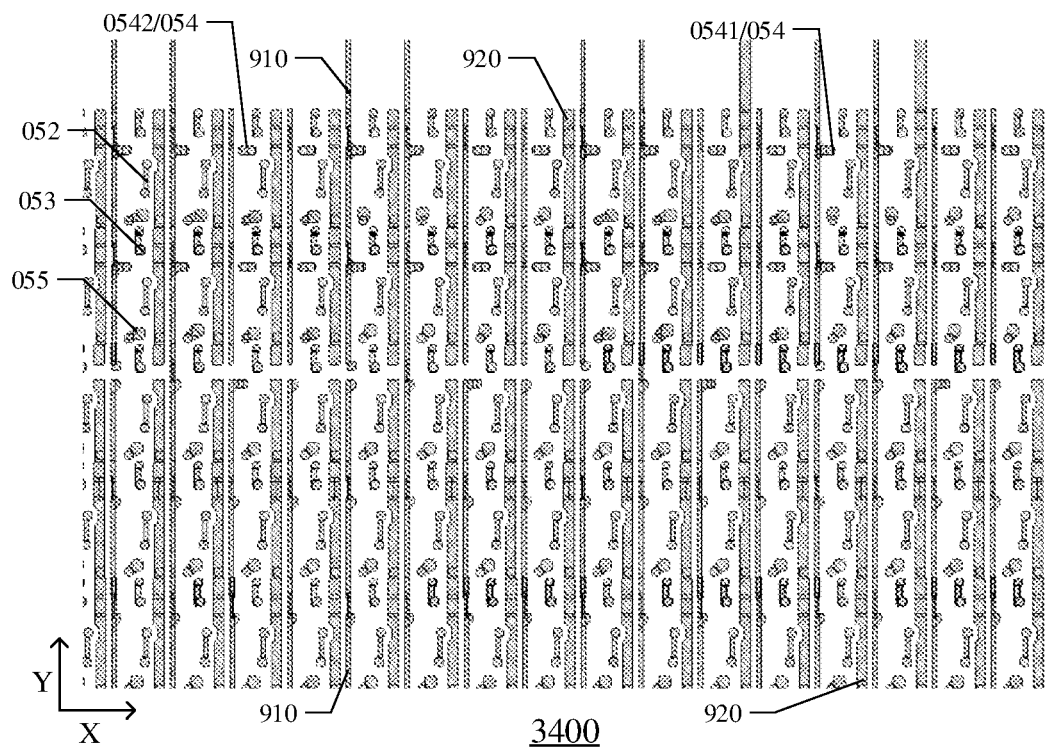
FIG. 9 is a partial plane structure diagram of a source drain metal layer at a junction position between the third display region and the second display region and a junction position between the first display region and the second display region, provided by at least one embodiment of the present disclosure.
Figure 10:
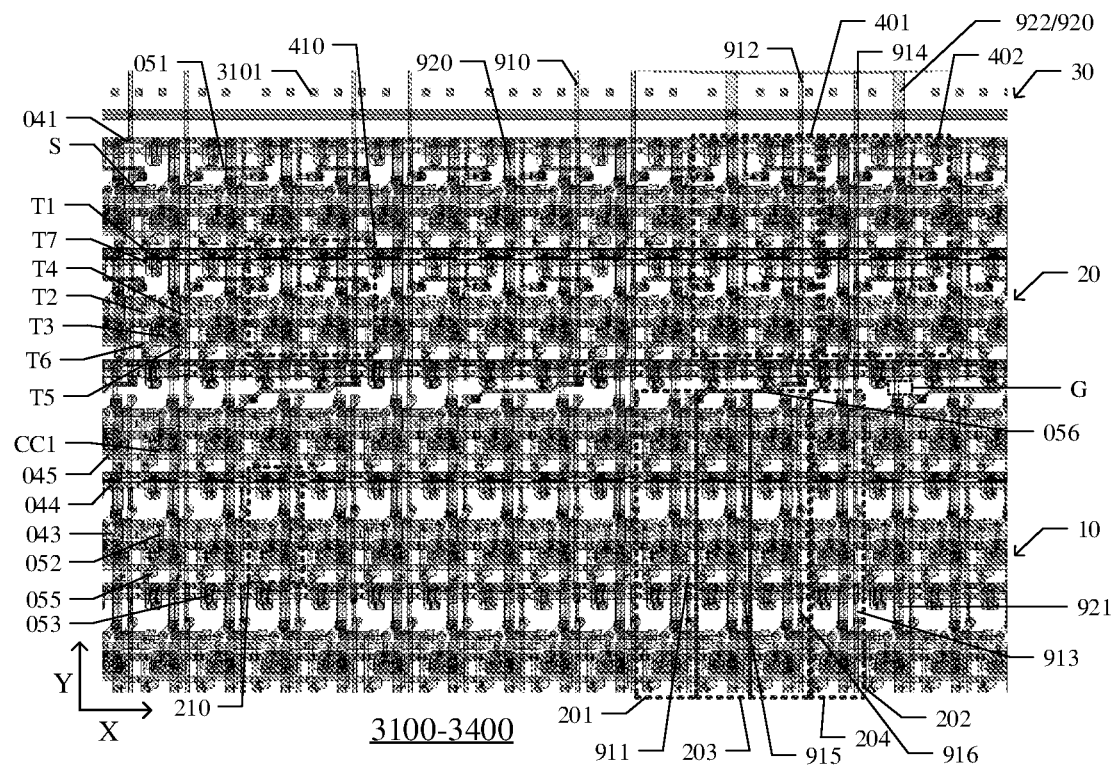
FIG. 10 is a schematic diagram of the lamination of the active semiconductor layer, the first conductive layer, the second conductive layer and the source and drain metal layers shown in FIGS. 6 to 9.

For example, FIG. 6 is a schematic diagram of a local plane structure of an active semiconductor layer at a junction position of a third display region and a second display region and a junction position of a first display region and a second display region provided by at least one embodiment of the present disclosure. FIG. 7 is a schematic diagram of a local plane structure of a first conductive layer at a junction position of a third display region and a second display region and a junction position of a first display region and a second display region. FIG. 8 is a partial plane structure diagram of a second conductive layer at a junction position of the third display region and the second display region and at a junction position of the first display region and the second display region. FIG. 9 is a partial plane structure diagram of a source drain metal layer at a junction position of the third display region and the second display region and a junction position of the first display region and the second display region. FIG. 10 is a layout schematic diagram of the active semiconductor layer, the first conductive layer, the second conductive layer, and the source drain metal layer shown in FIGS. 6 to 9.

For example, as illustrated by FIGS. 6 to 10, the active semiconductor layer 3100 may be formed by patterning a semiconductor material. The active semiconductor layer 3100 can be used to form active layers of the second reset transistor T1, the threshold compensation transistor T2, the driving transistor T3, the data writing transistor T4, the second light emission control transistor T5, the first light emission control transistor T6 and the first reset control transistor T7 which are mentioned above. The active semiconductor layer 3100 includes an active layer pattern (channel region) and a doped region pattern (source drain doped region) of each transistor of each sub-pixel, and the active layer pattern and the doped region pattern of each transistor in the same pixel circuit are integrally arranged.

It should be noted that the active layer may include an integrated low-temperature polysilicon layer, and the source region and the drain region may be conducted by doping or the like to realize the electrical connection of the structures. That is, the active semiconductor layer of respective transistors of each sub-pixel is an integral pattern formed by p-silicon, and respective transistors in the same pixel circuit includes a doped region pattern (i.e., a source region and a drain region) and an active layer pattern, and the active layers of different transistors are separated by a doped structure.

For example, the active semiconductor layer 3100 can be made of amorphous silicon, polysilicon, oxide semiconductor materials, etc. It should be noted that the above-mentioned source region and drain region may be regions doped with n-type impurities or p-type impurities.

In FIG. 6, the dotted rectangular boxes show the overlapping parts of the first conductive layer 3200 and the active semiconductor layer 3100. As a channel region of each transistor (i.e., the above-mentioned active layer pattern), the active semiconductor layers on both sides of each channel region are conducted as the first electrode and second electrode of each transistor (i.e., the above-mentioned doped region pattern) by ion doping or other processes. The source electrode and the drain electrode of the transistor can be symmetrical in structure, so the source electrode and the drain electrode can have no difference in physical structure. In the embodiment of the present disclosure, in order to distinguish the transistors, except the gate electrode as the control electrode, one of the source electrode and the drain electrode is directly described as the first electrode and the other of the source electrode and the drain electrode is directly described as the second electrode, so the first electrode and the second electrode of all or part of the transistors in the embodiment of the present disclosure are interchangeable as required.

For example, each pixel circuit group among the plurality of first pixel circuit groups, the plurality of second pixel circuit groups and the plurality of third pixel circuit groups includes a plurality of thin film transistors, for example, the plurality of thin film transistors include a second reset transistor T1, a threshold compensation transistor T2, a driving transistor T3, a data writing transistor T4, a second light emission control transistor T5, a first light emission control transistor T6 and a first reset control transistor T7.

For example, the active semiconductor layer 3100 includes an active layer pattern 3102 and a doped region pattern 3103 of each thin film transistor, and the active semiconductor layer 3100 also includes a dummy pattern 3101. For example, the dummy pattern 3101 may be located in the third display region 30. For example, the dummy pattern 3101 may include a plurality of block patterns arranged along the first direction X, and the plurality of block patterns may be uniformly distributed or unevenly distributed, which is not limited by the embodiment of the present disclosure.

For example, the display substrate includes a gate insulating layer located at a side of the active semiconductor layer away from the base substrate, the gate insulating layer is used to insulate the active semiconductor layer 3100 from the first conductive layer 3200 (i.e., the gate metal layer) formed later. FIG. 7 shows that the display substrate includes a first conductive layer 3200, which is disposed on the gate insulating layer so as to be insulated from the active semiconductor layer 3100. The first conductive layer 3200 may include a second electrode CC2 of the capacitor C, a plurality of scanning signal lines 043, a plurality of reset control signal lines 044, a plurality of light emission control signal lines 045 extending in the first direction X, and gate electrodes of the second reset transistor T1, the threshold compensation transistor T2, the driving transistor T3, the data writing transistor T4, the second light emission control transistor T5, the first light emission control transistor T6 and the first reset control transistor T7.

For example, as illustrated by FIGS. 6 to 10, the gate electrode of the data writing transistor T3 may be a part of the scanning signal line 043 overlapping with the active semiconductor layer 3100; the gate electrode of the first light emission control transistor T6 may be a first part of the light emission control signal line 045 overlapping with the active semiconductor layer 3100, and the gate electrode of the second light emission control transistor T5 may be a second part of the light emission control signal line 045 overlapping with the active semiconductor layer 3100. The gate electrode of the second reset transistor T1 is a first part of the reset control signal line 044 overlapping with the active semiconductor layer 3100, and the gate electrode of the first reset control transistor T7 is a second part of the reset control signal line 044 overlapping with the active semiconductor layer 3100. The threshold compensation transistor T2 may be a thin film transistor with a double gate structure, a first gate electrode of the threshold compensation transistor T2 may be a part of the scanning signal line 043 overlapping with the active semiconductor layer 3100, and a second gate electrode of the threshold compensation transistor T2 may be a part where a protruding structure P protruding from the scanning signal line 043 overlaps the active semiconductor layer 3100. As illustrated by FIG. 7, the gate electrode of the driving transistor T1 can be the second electrode CC2 of the capacitor C.

For example, as illustrated by FIGS. 6 to 10, the scanning signal line 043, the reset control signal line 044 and the light emission control signal line 045 are arranged along the second direction Y. The scan signal line 043 is located between the reset control signal line 044 and the light emission control signal line 045.

For example, in the second direction Y, the second electrode CC2 of the capacitor C (i.e., the gate electrode of the driving transistor T1) is located between the scanning signal line 043 and the light emission control signal line 045. The protruding structure P protruding from the scanning signal line 043 is located at a side of the scanning signal line 043 away from the light emission control signal line 045.

For example, the gate insulating layer located at a side of the first conductive layer 3200 away from the active semiconductor layer 3100 includes a plurality of via holes for exposing the doped region patterns and dummy patterns in the active semiconductor layer 3100.

For example, a first insulating layer is formed on the first conductive layer 3200 to insulate the first conductive layer 3200 from the second conductive layer 3300 formed later.

For example, the first insulating layer includes via holes for exposing the above dummy patterns, the doped region patterns of part of the thin film transistors, and the second electrode CC2 of the capacitor C.

For example, as illustrated by FIGS. 6 to 10, the second conductive layer 3300 includes a first electrode CC1 of the capacitor C and a plurality of reset power signal lines 041 extending along the first direction X. The first electrode CC1 of the capacitor C and the second electrode CC2 of the capacitor C at least partially overlap with each other to form the capacitor C.

For example, as illustrated by FIGS. 6 to 10, the source drain metal layer 3400 includes a data line 910 and a power signal line 920 which extend in the first direction X. The data line 910 is electrically connected with the second electrode of the data writing transistor T2 through a via hole penetrating through the gate insulating layer, the first insulating layer and the second insulating layer. The power signal line 920 (for example, the power signal line located in the first display region 10) is electrically connected with the first electrode of the second light emission control transistor T5 through a via hole penetrating through the gate insulating layer, the first insulation layer and the second insulation layer. The power signal lines 920 and the data lines 910 are alternately arranged along the second direction Y. The power signal line 920 is electrically connected with the first electrode CC1 of the capacitor C through a via hole penetrating the second insulating layer.

For example, a passivation layer and a planarization layer may be provided at a side of the source drain metal layer 3400 away from the base substrate to protect the source drain metal layer 3400.

For example, as illustrated by FIGS. 6 to 10, the display substrate provided by the embodiment of the present disclosure further includes a plurality of first connection portions 051, a first end of each of at least part of the first connection portion 051 is connected with the second electrode of the data writing transistor T4 of one sub-pixel circuit in the second pixel circuit 410, and a second end of the first connection portion 051 is connected with the second electrode of the data writing transistor T4 of another sub-pixel circuit in the second pixel circuit 410, to connect two data writing transistors T4 of the second pixel circuit 410 with the same data line 910. For example, along the second direction Y, at least part of the first connection portion 051 is located between the second electrode of the data writing transistor T2 and the first electrode of the first reset control transistor T7 in one sub-pixel circuit.

In the embodiment of the present disclosure, the second electrodes of the data writing transistors of at least two sub-pixel circuits (i.e., at least one second pixel circuit) in the second display region 20 are connected through the first connection portion to drive the same light emitting unit 120 to emit light, which can increase the current and brightness of the light emitting unit 120 in the second display region 20, for example, the current and brightness of the light emitting unit 120 in the second display region 20 can be increased to 1.8 to 2 times as much as that in the case where the light emitting unit is driven by one sub-pixel circuit, thus achieving a better performance.

For example, along the second direction Y, the first connection portion 051 is located between the second electrode of the threshold compensation transistor T3 and the first electrode of the first reset control transistor T7 in one sub-pixel circuit.

For example, the first connection portion 051 is arranged on the same layer as the reset power signal line 041.

For example, a second insulating layer is formed on the second conductive layer 3300, which is used to insulate the second conductive layer 3300 from the source drain metal layer 3400 formed later.

For example, the second insulating layer includes via holes exposing the above-mentioned dummy patterns and other structures.

For example, the source drain metal layer is connected with the doped region pattern through a first via hole in the insulating layer between the source drain metal layer and the active semiconductor layer. According to the embodiment of the present disclosure, the dummy pattern is arranged at a position outside an edge of the second display region, and the insulating layers between the source drain metal layer and the active semiconductor layer are all patterned (e.g., etched) to expose the dummy pattern, so that the insulating layers in the second display region can be uniformly etched to form via holes, thereby ensuring that the via holes in the insulating layer corresponding to the driving transistors in the second display region have better etching uniformity. For example, the insulating layer between the dummy pattern and the planarization layer is patterned to form a via hole to expose the dummy pattern, and the planarization layer is configured to fill the via hole.

For example, as illustrated by FIGS. 6 to 10, the second pixel circuit 410 includes two sub-pixel circuits that are adjacent to each other, the two sub-pixel circuits that are adjacent to each other drive the same light emitting unit to emit light, and two data writing transistors of the two sub-pixel circuits that are adjacent to each other are connected with the same data line. The first pixel circuit 210 includes only one sub-pixel circuit, and two sub-pixel circuits which are adjacent to each other each drives one light emitting unit to emit light. The two data writing transistors in the two pixel circuits that are adjacent to each other are independent from each other and connected with different data lines respectively. The layout difference between the first pixel circuit and the second pixel circuit in the embodiment of the present disclosure mainly lies in whether the first connection portion is provided, the position of the second electrode of the data writing transistor connected with the first connection portion, and the positional relationship between a fourth connection portion and the data line in the source drain metal layer.

For example, as illustrated by FIGS. 6 to 10, the density of the plurality of first pixel circuits 210 is a first density, the density of the plurality of second pixel circuits 410 is a second density, and the first density is not less than the second density. For example, the first density is greater than the second density. In the embodiment of the present disclosure, "the first density is greater than the second density" can refer to that the number of first pixel circuits is greater than the number of second pixel circuits in the same area.

For example, as illustrated by FIGS. 6 to 10, each first pixel circuit 210 includes only one sub-pixel circuit, and each second pixel circuit 410 includes two sub-pixel circuits. The density of sub-pixel circuits in the first display region 10 is approximately equal to the density of sub-pixel circuits in the second display region 20, that is, the number of sub-pixel circuits included in the first pixel circuit is approximately equal to the number of sub-pixel circuits included in the second pixel circuit in the same area.

For example, in the case where each second pixel circuit includes two sub-pixel circuits, only one sub-pixel circuit may be connected with the light emitting unit, or two sub-pixel circuits may be connected with the same light emitting unit, and the embodiment of the present disclosure is not limited thereto. Upon two sub-pixel circuits being connected with the same light emitting unit, the current and brightness of the light emitting unit can be increased, and a more uniform full-screen visual display effect can be realized.

For example, as illustrated by FIGS. 6 to 10, each pixel circuit further includes a second connection portion 052 and a third connection portion 053 which are arranged on the same layer as the data line 910, the second connection portion 052 is configured to connect the second electrode of the threshold compensation transistor T2 with the gate electrode of the driving transistor T3, and the third connection portion 053 is configured to connect the first electrode of the first reset control transistor T7 with the reset power signal line 041. For example, one end of the second connection portion 052 is electrically connected with the second electrode of the threshold compensation transistor T2 through a via hole penetrating through the gate insulating layer, the first insulation layer and the second insulation layer, and the other end of the second connection portion 052 is electrically connected with the gate electrode of the driving transistor T3 (i.e., the second electrode CC2 of the capacitor C) through a via hole penetrating through the first insulation layer and the second insulation layer. One end of the third connection portion 053 is electrically connected with the reset power signal line 041 through a via hole penetrating the second insulating layer, and the other end of the third connection portion 053 is electrically connected with the first electrode of the first reset control transistor T7 through a via hole penetrating the gate insulating layer, the first insulating layer and the second insulating layer.

For example, as illustrated by FIGS. 6 to 10, the first connection portion 051 is located on different layers from the data line 910, and each first connection portion 051 overlaps with the data line 910 and the power signal line 920 along a third direction perpendicular to the base substrate. For example, one data line 910 and one power signal line 920 are arranged between two data writing transistors T4 included in the second pixel circuit 410, and the first connection portion 051 connecting the two data writing transistors T4 overlaps with both the data line 910 and the power signal line 920.

For example, as illustrated by FIGS. 6 to 10, each pixel circuit further includes a fourth connection portion 054 arranged on the same layer as the data line 910, the fourth connection portion is configured to connect the first connection portion 051 and the second electrode of the data writing transistor T4, and the fourth connection portion 054 of one sub-pixel circuit in the second pixel circuit 410 is spaced from the immediately adjacent data line 910, and the fourth connection portion 054 of another sub-pixel circuit in the second pixel circuit 410 and the data line 910 are integrated to achieve that the second pixel circuit 410 is only connected with one data line 910. The "immediately adjacent data line" in the above-mentioned "fourth connection portion 054 is spaced from the immediately adjacent data line 910" refers to that there is no other data line between the fourth connection portion 054 and the data line 910.

For example, as illustrated by FIGS. 6 to 10, the fourth connection portion 054 integrated with the data line 910 is a first sub portion 0541, and the fourth connection portion 054 spaced from the immediately adjacent data line 910 is a second sub-portion 0542. Because there is no pixel circuit pair design in the first pixel circuit, the fourth connection portions of two adjacent pixel circuits in the first pixel circuit arranged along the first direction X or the second direction Y are integrated with corresponding data lines to realize the electrical connection between each pixel circuit and the corresponding data line.

For example, as illustrated by FIGS. 6 to 10, the display substrate further includes a plurality of cover portions S arranged on the same layer as the first connection portion 051, and each threshold compensation transistor T2 includes two gate electrodes and an active semiconductor layer 3100 located between the two gate electrodes. In the third direction, the covering portion S overlaps with all of the active semiconductor layer 3100, the data line 910 and the power signal line 920 between the two gate electrodes.

For example, upon the threshold compensation transistor T2 being turned off, the active semiconductor layer between two channels of the double-gate threshold compensation transistor T2 is in a floating state, and the threshold compensation transistor T2 is easy to be affected by the surrounding line voltage to jump, which will affect the leakage current of the threshold compensation transistor T2, thus affecting the luminous brightness. In order to keep the voltage of the active semiconductor layer between the two channels of the threshold compensation transistor T2 stable, a capacitor is designed to be formed between the cover portion S and the active semiconductor layer between the two channels of the threshold compensation transistor T2, and the cover portion S can be connected with the power signal line 920 to obtain a constant voltage, so the voltage of the active semiconductor layer in a floating state can be kept stable. The cover portion S overlaps with the active semiconductor layer between the two channels of the double-gate threshold compensation transistor T2, which can also prevent the active semiconductor layer between the two gate electrodes from being illuminated to change its characteristics, for example, to prevent the voltage of this part of the active semiconductor layer from changing, so as to prevent crosstalk. For example, the power signal line 920 may be electrically connected with the cover portion S through a via hole penetrating the second insulating layer to provide a constant voltage to the cover portion S.

For example, as illustrated by FIGS. 6 to 10, the first connection portion 051 includes a main connection portion extending in the first direction X and two end portions located at both ends of the main connection portion and extending in the second direction Y. The two end portions are respectively connected with the two fourth connection portions 054 of the second pixel circuit 410, and the main connection portion and the two end portions are formed in a zigzag shape to keep a distance from the cover portion. The embodiment of the present disclosure does not limit the shape of the first connection portion, as long as the first connection portion can keep a certain distance from other structures arranged on the same layer. For example, the main connection portion of the first connection portion can have a straight line type, a zigzag type or a wavy line type.

For example, in the second direction Y, a distance between the cover portion S and the second electrode of the threshold compensation transistor T2 is smaller than a distance between the cover portion S and the first electrode of the first reset control transistor T7, that is, the cover portion S is closer to the threshold compensation transistor T2. Therefore, in order to facilitate the design and keep a certain distance between the first connection portion 051 and the cover portion S, the first connection portion 051 is arranged closer to the first electrode of the first reset transistor T7.

For example, as illustrated by FIGS. 6 to 10, the plurality of data lines 910 include a first sub data line 911 and a second sub data line 912; the first display region 10 includes a first pixel circuit column 201, and the second display region 20 includes a second pixel circuit column 401. For example, the first pixel circuit column 201 includes one column of sub-pixel circuits, and the second pixel circuit column 401 includes two columns of sub-pixel circuits.

For example, as illustrated by FIGS. 6 to 10, the first pixel circuit column 201 and the second pixel circuit column 401 are located in different columns, that is, any column of sub-pixel circuits in the second pixel circuit column 401 is located in a different column from the first pixel circuit column. For example, the first sub data line 911 is connected with the first pixel circuit column 201, and the second sub data line 912 is connected with the second pixel circuit column 401, for example, the second sub data line 912 is connected with one column of sub-pixel circuits in the second pixel circuit column 401.

For example, as illustrated by FIGS. 6 to 10, the first sub data line 911 and the second sub data line 912 are connected by a data line connection portion 056, an extending direction of the data line connection portion 056 intersects the second direction Y, and the data line connection portion 056 and the data line 910 are located on different layers.

For example, as illustrated by FIGS. 1 to 10, at the junction position of the first display region 10 and the second display region 20, that is, at the intervals between the first pixel circuit 210 and the second pixel circuit 410, some data lines are provided with breaks so that some data lines located in the first display region 10 and the second display region 20 are disconnected at the intervals. In the embodiment of the present disclosure, the junction position of the first display region 10 and the second display region 20 refers to an interval between the first electrode of the first reset transistor and the second electrode of the data write transistor of the pixel circuit in one pixel circuit row of the first display region 10 close to the second display region 20.

For example, as illustrated by FIG. 1 to FIG. 10, the data line 910 located on the same straight line (straight line extending in Y direction) as the first sub data line 911 and located in the second display region 20 is spaced apart from the first sub data line 911, and the data line 910 located in the second display region 20 is not used to transmit data signal, but the first sub data line 911 and the second sub data line 912 are connected by the data line connection portion 056, so that the first sub data line 911 and the second sub data line 912 are configured to transmit the same data signal. For example, as illustrated by FIGS. 1 to 10, the second sub data line 912 is not only connected with the second pixel circuit column 401, but also bypasses the edge of the third display region 30 and passes through the transition region 40 to provide data signals for the sub-pixel circuits in the transition region 40.

For example, as illustrated by FIGS. 6 to 10, the first display region 10 further includes a third pixel circuit column 202, and the second display region 20 further includes a fourth pixel circuit column 402. For example, the third pixel circuit column 202 includes one column of sub-pixel circuits, and the fourth pixel circuit column 402 includes two columns of sub-pixel circuits. For example, the third pixel circuit column 202 and at least part of the fourth pixel circuit column 402 are located in the same column, for example, the third pixel circuit column 202 is located in the same column as one column of sub-pixel circuits in the fourth pixel circuit column 402.

For example, as illustrated by FIGS. 6 to 10, the plurality of data lines 910 further include a third sub data line 913 and a fourth sub data line 914, the third sub data line 913 is connected with the third pixel circuit column 202, the fourth sub data line 914 is connected with the fourth pixel circuit column 402, for example, the fourth sub data line 914 is connected with one column of sub-pixel circuits in the fourth pixel circuit column 402.

For example, as illustrated by FIGS. 6 to 10, the third sub data line 913 and the fourth sub data line 914 are one continuous data line extending in the second direction Y.

For example, as illustrated by FIGS. 1 to 10, at a junction position of the first display region 10 and the second display region 20, that is, at an interval between the first pixel circuit 210 and the second pixel circuit 410, some data lines are continuous, so that the continuous data lines are configured to transmit the same data signals to the first pixel circuits and the second pixel circuits connected with the data lines.

For example, as illustrated by FIGS. 1 to 10, the data line 910 further includes a fifth sub data line 915 and a sixth sub data line 916, and the first display region 10 further includes a fifth pixel circuit column 203 and a sixth pixel circuit column 204, the fifth sub data line 915 is connected with the fifth pixel circuit column 203, and the sixth sub data line 916 is connected with the sixth pixel circuit column 204. The fifth sub data line 915 is insulated from the data lines in the second display region 20, and the sixth sub data line 916 is insulated from the data lines in the second display region 20, then the fifth sub data line 915 and the sixth sub data line 916 are only configured to provide data signals to the first pixel circuits in the first display region 10.

For example, as illustrated by FIG. 10, the fifth pixel circuit column 203 is located in the same column as one column of sub-pixel circuits of the second pixel circuit column 401, and the sixth pixel circuit column 204 is located in the same column as the other column of sub-pixel circuits of the second pixel circuit column 401.

For example, as illustrated by FIG. 10, the data line located on the same straight line as the fifth sub data line 915 and located in the second display region 20 is not connected with any pixel circuit, and is spaced apart from the fifth sub data line 915. The data line located on the same straight line as the sixth sub data line 916 and located in the second display region 20 is not connected with any pixel circuit, and is spaced from the fifth sub data line 915.

Figure 11:
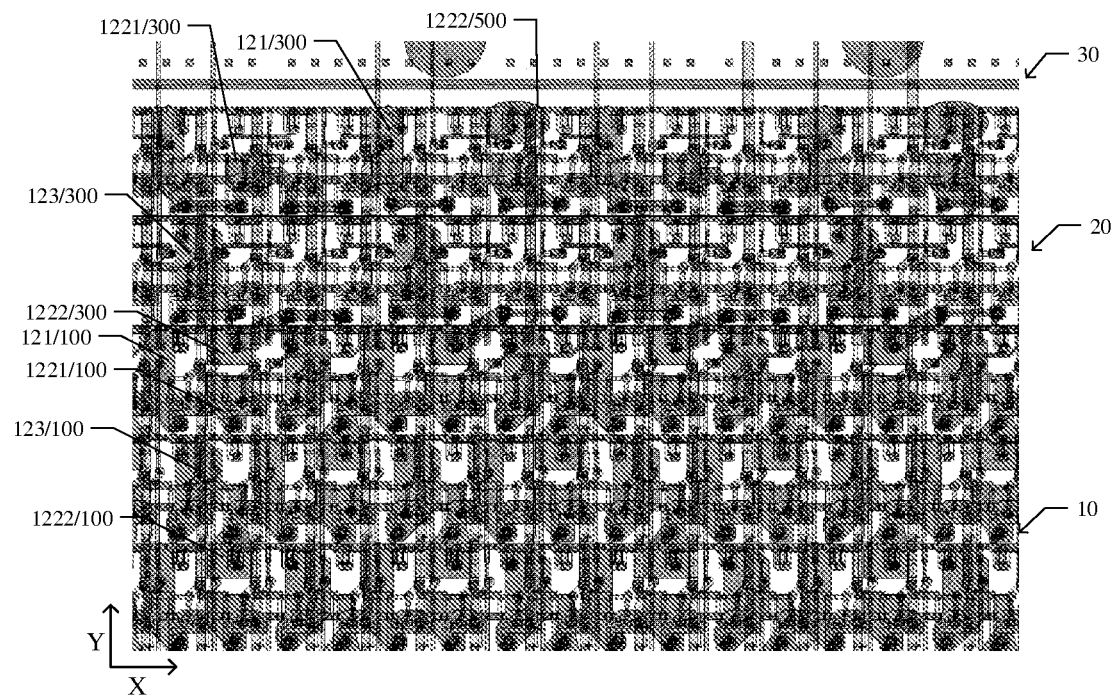
FIG. 11 is a partial plane structure diagram of the second electrode of the light emitting unit shown in FIG. 4 arranged on the pixel circuit layout shown in FIG. 10.

For example, FIG. 11 is a schematic diagram of a partial plane structure in which the second electrode of the light emitting unit shown in FIG. 4 is arranged on the pixel circuit layout shown in FIG. 10. As illustrated by FIG. 1 to FIG. 11, the second display region 20 may include three rows of light emitting units, and the second pixel circuits connected with the three rows of light emitting units are arranged in two rows, so that the fourth light emitting unit 1222 in the second light emitting unit group 300 is located in the same row as the second light emitting unit 121 and the third light emitting unit 123 in the first light emitting unit group 100, but the second pixel circuit 410 connected with the fourth light emitting unit 1222 in the second light emitting unit group 300 and the first pixel circuit 210 connected with the second light emitting unit 121 in the first light emitting unit group 100 are located in different rows.

In the embodiment of the present disclosure, data signals are transmitted from the source drive integrated circuit located at a side of the first display region away from the second display region to the pixel circuits in the first display region and the second display region and some pixel circuits in the transition region through data lines, the data signal transmitted to the pixel circuit connected with one kind of light emitting unit (e.g. light emitting unit of the same color) in the second display region should be the same as the data signal transmitted to the pixel circuit connected with the same kind of light emitting unit (e.g. light emitting unit of the same color) in the first display region, and the data signal transmitted to the pixel circuit connected with one kind of light emitting unit (e.g. light emitting unit of the same color) in the second display region should be the same as the data signal transmitted to the pixel circuit connected with the same kind of light emitting unit (e.g. light emitting unit of the same color) in the transition region. Therefore, in the case where first pixel circuits in the same first pixel circuit column of the first display region are connected with the same data line, and two sub-pixel circuits in the second pixel circuit in the second display region are connected with the same data line, for example, the problem that the data signal transmitted to the first pixel circuit connected with the second light emitting unit in the first display region is the same as the data signal transmitted to the second pixel circuit connected with the first light emitting unit or the fourth light emitting unit in the second display region is easy to occur, thereby resulting in data signal mismatch between the first display region and the second display region.

For example, as illustrated by FIGS. 1 to 11, in the embodiment of the present disclosure, the case where the plurality of light emitting units 120 connected with the third sub-pixel circuit column 202 in the first display region 10 include the second light emitting unit 121 and the third light emitting unit 123, and the plurality of light emitting units 120 connected with the first pixel circuit column 201 in the first display region 10 include the first light emitting unit 1221 and the fourth light emitting unit 1222, the plurality of light emitting units 120 connected with the second pixel circuit column 401 in the second display region 20 include the first light emitting unit 1221 and the fourth light emitting unit 1222, and the plurality of light emitting units 120 connected with the fourth pixel circuit column 402 in the second display region 20 include the second light emitting unit 121 and the third light emitting unit 123 is taken as an example.

For example, in the first display region 10, the second light emitting unit 121 and the third light emitting unit 123 are located in different rows, the first light emitting unit 1221 and the fourth light emitting unit 1222 are arranged along the second direction Y, the second light emitting unit 121 and the first light emitting unit 1221 or the fourth light emitting unit 1222 are arranged along the first direction X, and the directions pointing from the second light emitting unit 121 to the third light emitting unit 123 in two adjacent first light emitting unit groups 100 are opposite to each other.

For example, the first pixel circuit column 201, the fifth pixel circuit column 203, the sixth pixel circuit column 204, and the third pixel circuit column 202 form one pixel circuit column group, and the light emitting units connected with four first pixel circuits located in the first pixel circuit column group and located in a row of first pixel circuits in the first display region close to the second display region 20 are the first light emitting unit 1221, the third light emitting unit 123, the fourth light emitting unit 1222 and the second light emitting unit 121 in turn. The four light emitting units connected with the second row of pixel circuits located in the above-mentioned pixel circuit column group and located in the first display region close to the second display region are the fourth light emitting unit 1222, the second light emitting unit 121, the first light emitting 1221 and the third light emitting 123 in turn. Therefore, the second light emitting unit and the third light emitting unit connected with the pixel circuits of the fifth pixel circuit column and the third pixel circuit column have different arrangements, and the first light emitting unit and the fourth light emitting unit connected with the pixel circuits of the first pixel circuit column and the sixth pixel circuit column have different arrangements. The data signals transmitted by the data lines are related to the arrangement of the corresponding light emitting units (for example, light emitting units of corresponding colors), and the first display region and the second display region should transmit the matched data signals according to the arrangement of the light emitting units.

For example, as illustrated by FIGS. 1 to 11, a plurality of light emitting units 120 connected with the fourth pixel circuit column 402 in the second display region 20 include second light emitting units 121 and third light emitting units 123 that are alternately arranged, and the light emitting units 120 connected with the pixel circuits located in a row in the second display region 20 close to the first display region 20 and belong to the second pixel circuit column 401 are, for example, the third light emitting units 123. A plurality of light emitting units 120 connected with the third pixel circuit column 202 in the first display region 10 include second light emitting units 121 and third light emitting units 123 arranged alternately, and the light emitting units 120 connected with the pixel circuits located in a row in the first display region 10 close to the second display region 20 and belong to the third pixel circuit column 202 are the second light emitting units 121. Therefore, the pixel circuits in a row of pixel circuits in the first display region close to the second display region and connected with the third sub data line are connected with the second light emitting units, and the pixel circuits in a row of pixel circuits in the second display region close to the first display region and connected with the fourth sub data line are connected with the third light emitting units, and the arrangement of the light emitting units is matched with the data signals transmitted by the third sub data line, then the third sub data line and the fourth sub data line are a continuous data line extending in the second direction, that is, the third sub data line and the fourth sub data line can be continuous at a junction position of the first display region and the second display region without being disconnected at the junction position of the two display regions.

For example, as illustrated by FIGS. 1 to 11, the light emitting units 120 connected with the second pixel circuit column 401 in the second display region 20 include first light emitting units 1221 and fourth light emitting units 1222 which are alternately arranged, and the light emitting units 120 connected with the pixel circuits located in a row of the second display region 20 close to the first display region 10 and belong to the second pixel circuit column 401 are, for example, the fourth light emitting units 1222. A plurality of light emitting units 120 connected with the sixth pixel circuit column 204 in the first display region 10 include first light emitting units 1221 and fourth light emitting units 1222 arranged alternately, and the light emitting units 120 connected with the pixel circuits located in a row in the first display region 10 close to the second display region 20 and belong to the sixth pixel circuit column 204 are also the fourth light emitting units 1222. Therefore, the light emitting units connected with the pixel circuits located in a row of pixel circuits in the first display region close to the second display region and belong to the second pixel circuit column and the light emitting units connected with the pixel circuits located in a row of pixel circuits in the second display region close to the first display region and belong to the sixth pixel circuit column are the same light emitting units, then the data signals of the second sub data line connected with the second pixel circuit column of the first display region and the data signals of the sixth sub data line connected with the sixth pixel circuit column of the second display region do not match, so that the second sub data line is spaced apart from the sixth sub data line at the junction position of the first display region and the second display region.

For example, as illustrated by FIGS. 1 to 11, a plurality of light emitting units 120 connected with the first pixel circuit column 201 in the first display region 10 include first light emitting units 1221 and fourth light emitting units 1222 arranged alternately, and the light emitting units 120 connected with the pixel circuit located in a row in the first display region 10 close to the second display region 20 and belong to the first sub-pixel circuit column 201 are the first light emitting units 1221. Therefore, the data signals of the second sub data line connected with the second pixel circuit column of the second display region matches the data signals of the first sub data line connected with the first pixel circuit column of the first display region, the first sub data line located in the first display region is connected with the second sub data line located in the second display region through the data line connection portion, so as to meet the unified algorithm processing of the integrated circuit (IC) in the first display region and the second display region.

In the embodiment of the present disclosure, the first sub data line and the second sub data line are connected by the data line connection portion at the junction position of the first display region and the second display region, so that the data signals transmitted from the data line to the light emitting units in the first display region can be matched with the data signals transmitted from the data line to the light emitting units in the second display region.

For example, as illustrated by FIGS. 1 to 11, the data line connection portion 056 and the plurality of data lines 910 are located in different layers.

For example, as illustrated by FIGS. 1 to 11, the data line connection portion 056 is located on the same layer as the reset power signal line 041 to facilitate the design.

For example, as illustrated by FIGS. 6 to 11, the plurality of power signal lines 920 include a plurality of first sub power signal lines 921 and a plurality of second sub power signal lines 922, the plurality of first sub power signal lines 921 are connected with a plurality of first pixel circuit groups 200, and the plurality of second sub power signal lines 922 are connected with a plurality of second pixel circuit groups 400, and each first sub power signal line 921 is configured to transmit a first power supply signal, and each second sub power signal line 922 is configured to transmit a second power supply signal. In the embodiment of the present disclosure, in the case where the first pixel circuit includes only one sub-pixel circuit and the second pixel circuit includes two sub-pixel circuits, the power signals required by the first pixel circuit and the second pixel circuit are different. For example, the power signal required by the first pixel circuit is smaller than the power signal required by the second pixel circuit, the first sub power signal line connected with the first pixel circuit and the second sub power signal line connected with the second pixel circuit are configured to transmit different power signals.

For example, the plurality of second sub power signal lines 922 include a second sub power signal line 922 located on the same straight line as at least one first sub power signal line 921, and a gap G is provided between the first sub power signal line 921 and the second sub power signal line 922 located on the same straight line. In the embodiment of the present disclosure, the two signal lines located on the same straight line refer to that the two signal lines can be passed through by the same straight line.

For example, the first power signal can be transmitted from an integrated circuit located at a side of the first display region away from the second display region to the pixel circuit in the first display region through the first sub power signal line. For example, the second sub power signal line may be connected with a third sub power signal line in the transition region through a structure in the second conductive layer, and the third sub power signal line in the transition region is connected with another integrated circuit to provide the second power signal line.

Figure 12:
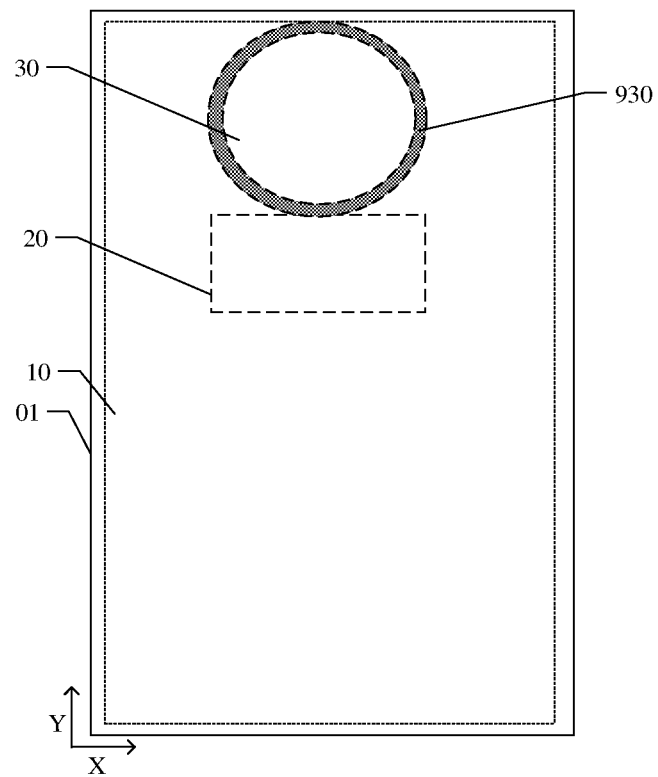
FIG. 12 is a schematic diagram of a planar structure of a display substrate provided by at least one embodiment of the present disclosure.
Figure 13:
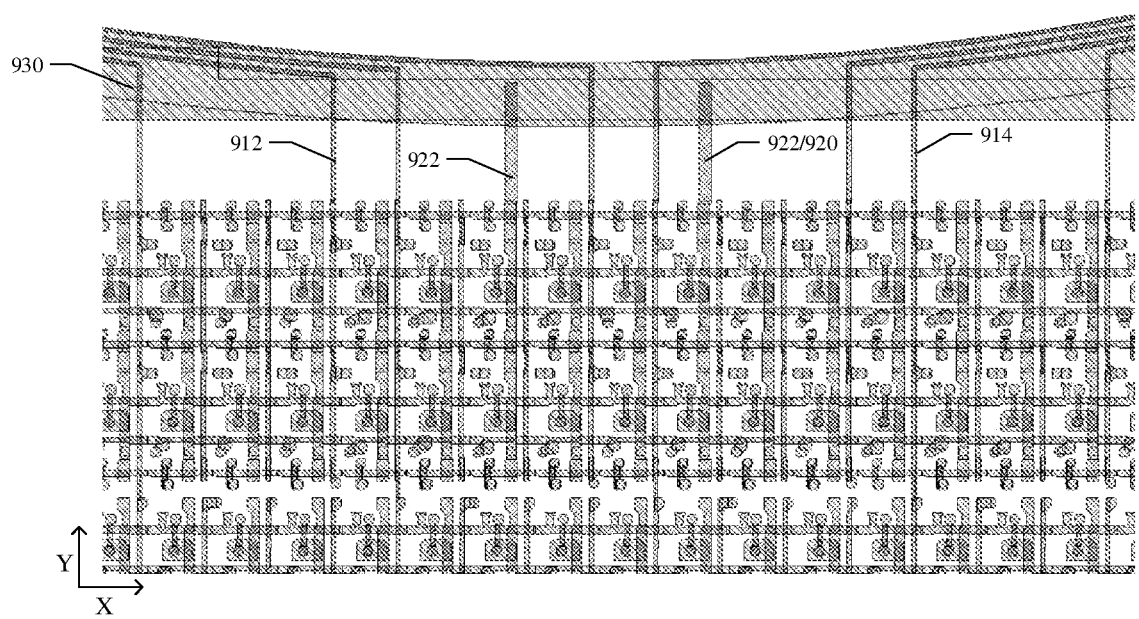
FIG. 13 is a partial structural diagram of the display substrate shown in FIG. 12.

For example, FIG. 12 is a schematic diagram of a planar structure of a display substrate provided in at least one embodiment of the present disclosure, and FIG. 13 is a schematic diagram of a partial structure of the display substrate shown in FIG. 12. This example is different from the examples shown in FIGS. 1 to 11 in that this example also includes a light shielding layer.

For example, as illustrated by FIGS. 12 and 13, the display substrate further includes a light shielding layer 930 located at an edge of the third display region 30. For example, as illustrated by FIGS. 12 and 13, the light shielding layer 930 overlaps with the second sub data line 912 and the fourth sub data line 914 in the direction perpendicular to the base substrate 01, that is, an orthographic projection of the light shielding layer 930 overlaps with orthographic projections of the second sub data line 912 and the fourth sub data line 914 on the base substrate 01. According to the embodiment of the present disclosure, the light shielding layer is arranged at the edge of the third display region 30, so that the data lines located at the edge of the third display region 30 and arranged in a winding manner can be prevented from being diffracted.

For example, a shape of the light shielding layer 930 may be annular, but is not limited thereto, and the shape of the light shielding layer 930 may be changed according to the shape of the third display region 30. For example, the outer contour of the light shielding layer 930 may be arc-shaped or broken to match the position of the light emitting unit group.

For example, the light shielding layer 930 is located at a side of the film layer where the second sub data line 912 is located (i.e., the film layer where the data connection portion is located) away from the film layer where the power signal line 920 is located. For example, the light shielding layer 930 can be located on the same layer as the first conductive layer shown in FIG. 7, so as to facilitate the manufacturing and reduce the manufacturing cost.

For example, at least one of the plurality of second sub power signal lines 922 is connected with the light shielding layer 930 to reduce the resistance of the second sub power signal line.

The features of each light emitting unit group and pixel circuit group in the first display region 10, the second display region 20 and the third display region 30 in this example may be the same as those of the corresponding structures in the examples shown in FIGS. 1 to 11, and the repeated portion will be omitted herein.

At least one embodiment of the present disclosure also provides a display device including any of the above display substrates.

For example, the display device provided by the embodiment of the present disclosure may be an organic light emitting diode display device.

For example, in the display device provided by the embodiment of the present disclosure, by arranging the second display region between the third display region and the first display region, it is beneficial to improve the bluish or dark phenomenon of the junction position of the third display region and the first display region, and further improve the display image quality of the third display region (such as the area where the under-screen camera is located).

For example, in the display device provided by the embodiment of the present disclosure, by adjusting the distances between the light emitting regions of adjacent first light emitting units in the first direction or the second direction, for example, by arranging the light emitting regions of the first light emitting units with unequal distances in the first direction or arranging the light emitting regions of the first light emitting units with unequal distances in the second direction, the possible overlapping phenomenon between the light emitting regions or light emitting layers of adjacent first light emitting units can be weakened or avoided, thereby weakening or avoiding the possible display effect on the display device.

For example, the display device may further include a cover plate on a display side of the display substrate. For example, the display device may further include a functional component located at a side of the base substrate away from the light emitting elements, for example, the functional component faces the second display region.

For example, the functional component may include at least one of a camera module (for example, a front camera module), a 3D structured light module (for example, a 3D structured light sensor), a time-of-flight 3D imaging module (for example, a time-of-flight sensor), an infrared sensing module (for example, an infrared sensing sensor), and the like.

For example, the front camera module is usually activated when the user takes a selfie or makes a video call, and the pixel display region of the display device displays the image obtained by the selfie for the user to watch. The front camera module includes a lens, an image sensor, an image processing chip, etc. The optical image generated by the lens of the scene is projected on the surface of the image sensor (the image sensor includes CCD and CMOS) and converted into an electrical signal, which is converted into a digital image signal by the image processing chip, and then sent to the processor for processing, and the image of the scene is output on the display screen.

For example, the 3D structured light sensor and the time of flight (ToF) sensor can be used for face recognition to unlock the display device.

For example, the functional component may only include a camera module to realize the function of selfie or video call; for example, the functional component may further include a 3D structured light module or a time-of-flight 3D imaging module to realize face recognition unlocking, etc. Embodiments of the present disclosure include but are not limited thereto.

For example, the above-mentioned display device can be any product or component with display function, such as a mobile phone a tablet computer, a notebook computer, a navigator, etc., with an under-screen camera, and the embodiments of the present disclosure are not particularly limited thereto.

The following points need to be explained:
(1) In the drawings of the embodiments of the present disclosure, only the structures related to the embodiments of the present disclosure are involved, and other structures can refer to the general design.
(2) The features of the same embodiment and different embodiments of the present disclosure can be combined with each other without conflict.

The above is only an exemplary embodiment of the present disclosure, and it is not intended to limit the scope of protection of the present disclosure, which is determined by the appended claims.

What is claimed is:
1. A display substrate, comprising:
a display region comprising a plurality of light emitting units,
wherein the plurality of light emitting units are arranged into a plurality of light emitting unit rows, and the light emitting units in one of the plurality of light emitting unit rows are arranged along a first direction;
the plurality of light emitting units comprise a plurality of first light emitting units;
in at least part of the display region:
distances, in the first direction, between a light emitting region of one of the first light emitting units and light emitting regions of two of the first light emitting units respectively adjacent to and located on both sides of the one of the first light emitting units in the first direction are different, and/or
distances, in a second direction, between a light emitting region of one of first light emitting units and light emitting regions of two of the first light emitting units adjacent to and located on both sides of the one of the first light emitting units in the second direction are different, and the first direction intersects the second direction;
the display substrate further comprising:
a base substrate; and a plurality of light emitting unit groups located on the base substrate, each of the plurality of light emitting unit groups comprising at least one of the light emitting units, wherein the display region comprises a first display region, a second display region and a third display region, the first display region is on at least one side of the third display region, at least part of the second display region is located between the first display region and the third display region, and the at least part of the display region comprises the second display region;

the at least one of the light emitting units in each of the plurality of light emitting unit groups further comprises a second light emitting unit and a third light emitting unit, the first light emitting unit, the second light emitting unit and the third light emitting unit are respectively configured to provide light of different colors, the at least one of the light emitting units in each of the plurality of light emitting unit groups further comprises a fourth light emitting unit, the first light emitting unit and the fourth light emitting unit are configured to provide light of a same color, the first direction is a row direction, the second direction is a column direction;

the second display region comprises a protruding region, and the first display region comprises a concave region, the protruding region of the second display region is inserted into the concave region of the first display region, one row of fourth light emitting units in the second display region is located in the protruding region of the second display region, so that the one row of fourth light emitting units in the second display region is located in the same row as the light emitting units in the first display region.

2. The display substrate according to claim 1, wherein, in at least one of the plurality of light emitting unit rows in the at least part of the display region, the distances, in the first direction, between the light emitting region of one of the first light emitting units and the light emitting regions of two of the first light emitting units adjacent to the one of the first light emitting units in the first direction are a first spacing distance and a second spacing distance, respectively;

light emitting regions of the first light emitting units included in the at least one of the light emitting unit rows are arranged at intervals along the first direction to form a plurality of spacings, the plurality of spacings comprise the first spacing distance and the second spacing distance, and the first spacing distance and the second spacing distance are alternately arranged in the first direction.

3. The display substrate according to claim 2, wherein, in the at least part of the display region, the distances, in the second direction, between the light emitting region of one of the first light emitting units and the light emitting regions of two of the first light emitting units adjacent to the one of the first light emitting units in the second direction are a third spacing distance and a fourth spacing distance, respectively;

in the second direction, spacings between light emitting regions of two adjacent ones of the first light emitting units in the second direction are arranged in such a way that the third spacing distance and the fourth spacing distance are alternately arranged.

4. The display substrate according to claim 2, the plurality of light emitting unit groups comprise a plurality of first light emitting unit groups located in the first display region, a plurality of second light emitting unit groups located in the second display region, and a plurality of third light emitting unit groups located in the third display region;

the at least one of the light emitting units in each of the plurality of light emitting unit groups comprises the first light emitting unit, in the first display region, light emitting regions of the first light emitting units located in a same one of the plurality of light emitting unit rows are arranged at equal intervals along the first direction, and a distance, in the first direction, between the light emitting regions of two adjacent ones of the first light emitting units located in the same one of the plurality of light emitting unit rows is a fifth spacing distance, at least one of the first spacing distance and the second spacing distance is different from the fifth spacing distance.

5. The display substrate according to claim 4, wherein, in the third display region, light emitting regions of the first light emitting units in a same one of the plurality of light emitting unit rows are arranged at equal intervals along the first direction, and a distance in the first direction between light emitting regions of two adjacent ones of the first light emitting units in the same one of the plurality of light emitting unit rows is a sixth spacing distance, at least one of the first spacing distance and the second spacing distance is different from the sixth spacing distance.

6. The display substrate according to claim 5, wherein the sixth spacing distance is greater than the first spacing distance, the first spacing distance is greater than the fifth spacing distance, and the fifth spacing distance is greater than the second spacing distance.

7. The display substrate according to claim 4, wherein an area of the light emitting region of at least one of the first light emitting units in the third display region is different from an area of the light emitting region of the first light emitting unit in the first display region, and/or an area of the light emitting region of at least one of the first light emitting units in the third display region is different from an area of the light emitting region of the first light emitting unit in the second display region.

8. The display substrate according to claim 4, wherein a ratio of an area of the light emitting region of at least one of the first light emitting units in the third display region to an area of the light emitting region of the first light emitting unit in the first display region ranges from 0.8 to 2.5, and/or a ratio of an area of the light emitting region of at least one of the first light emitting units in the third display region to an area of the light emitting region of each of the first light emitting units in the second display region ranges from 0.8 to 2.5.

9. The display substrate according to claim 4, wherein an area of the light emitting region of the first light emitting unit in the second light emitting unit group is less than or equal to an area of the light emitting region of the first light emitting unit in the third light emitting unit group adjacent to the second light emitting unit group.

10. The display substrate according to claim 4, wherein in at least one of the plurality of light emitting unit groups, the second light emitting unit and the third light emitting unit are located in different rows, and the first light emitting unit and the second light emitting unit are located in a same row.

11. The display substrate according to claim 1, wherein, in at least one of the plurality of second light emitting unit groups adjacent to the plurality of first light emitting unit groups, a distance, in the second direction, between the light emitting region of the first light emitting unit and the light emitting region of the fourth light emitting unit is a first distance,
- a distance, in the second direction, between the light emitting region of the fourth light emitting unit in the at least one of the plurality of second light emitting unit groups and the light emitting region of the first light emitting unit in the first light emitting unit group adjacent to the at least one of the plurality of second light emitting unit groups is a second distance, and the first distance is greater than the second distance.

12. The display substrate according to claim 11, wherein the first distance is greater than a size, in the second direction, of the light emitting region of the third light emitting unit in the second light emitting unit group.

13. The display substrate according to claim 11, wherein, in at least one of the second light emitting unit groups adjacent to the plurality of first light emitting unit groups, a first straight line extending in the first direction passes through the first light emitting unit and the second light emitting unit,
- a second straight line extending in the first direction passes through the fourth light emitting unit in the at least one of the second light emitting unit groups adjacent to the plurality of first light emitting unit groups and the second light emitting unit in the first light emitting unit groups.

14. The display substrate according to claim 13, wherein the plurality of second light emitting unit groups comprise first sub light emitting unit groups and second sub light emitting unit groups alternately arranged along the first direction, and at least one of the plurality of third light emitting unit groups adjacent to the plurality of second light emitting unit groups and the second sub light emitting unit group are located in a same column of light emitting unit groups;
- in at least one of the plurality of first light emitting unit groups, a distance between the light emitting region of the first light emitting unit and the light emitting region of the second light emitting unit is a third distance; in at least one of the first sub light emitting unit groups, a distance between the light emitting region of the first light emitting unit and the light emitting region of the second light emitting unit is a fourth distance; in at least one of the second sub light emitting unit groups, a distance between the light emitting region of the first light emitting unit and the light emitting region of the second light emitting unit is a fifth distance, the fifth distance is greater than the fourth distance, and the fourth distance is greater than the third distance.

15. The display substrate according to claim 14, wherein, in at least one of the first sub light emitting unit groups, a distance between a center line extending in the second direction of the light emitting region of the first light emitting unit and a center line extending in the second direction of the light emitting region of the fourth light emitting unit is a sixth distance;
- in at least one of the second sub light emitting unit groups, a distance between a center line extending in the second direction of the light emitting region of the first light emitting unit and a center line extending in the second direction of the light emitting region of the fourth light emitting unit is a seventh distance, and the seventh distance is greater than the sixth distance.

16. The display substrate according to claim 15, wherein, in at least one of the first sub light emitting unit groups, a distance between a center line extending in the second direction of the light emitting region of the second light emitting unit and a center line extending in the second direction of the light emitting region of the fourth light emitting unit is an eighth distance;
- in at least one of the second sub light emitting unit groups, a distance between a center line extending in the second direction of the light emitting region of the second light emitting unit and a center line extending in the second direction of the light emitting region of the fourth light emitting unit is a ninth distance, and a ratio of the ninth distance to the eighth distance ranges from 0.8 to 1.2.

17. The display substrate according to claim 4, further comprising a plurality of first pixel circuit groups, a plurality of second pixel circuit groups and a plurality of third pixel circuit groups,
- wherein the plurality of first pixel circuit groups are respectively connected with the plurality of first light emitting unit groups in one-to-one correspondence and are located in the first display region,
- the plurality of second pixel circuit groups are respectively connected with the plurality of second light emitting unit groups in one-to-one correspondence, and are located in the second display region,
- the plurality of third pixel circuit groups are respectively connected with the plurality of third light emitting unit groups in one-to-one correspondence, and are located in regions other than the third display region in the display substrate.

18. A display device, comprising the display substrate according to claim 1.

* * * * *